(12) United States Patent  
Ohnishi

(10) Patent No.: US 8,148,819 B2  
(45) Date of Patent: Apr. 3, 2012

(54) SEMICONDUCTOR DEVICE, METHOD FOR MOUNTING SEMICONDUCTOR DEVICE, AND MOUNTING STRUCTURE OF SEMICONDUCTOR DEVICE

(75) Inventor: Yuya Ohnishi, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 12/466,681

(22) Filed: May 15, 2009

(65) Prior Publication Data

US 2009/0283906 A1    Nov. 19, 2009

(30) Foreign Application Priority Data

May 19, 2008  (JP) ................................. 2008-130846

(51) Int. Cl.
*H01L 23/48* (2006.01)
*H01L 23/52* (2006.01)
*H01L 29/40* (2006.01)

(52) U.S. Cl. ........ 257/737; 257/741; 257/750; 257/762; 257/766; 257/772

(58) Field of Classification Search ........................ None
See application file for complete search history.

(56) References Cited

U.S. PATENT DOCUMENTS

| 5,461,261 | A | 10/1995 | Nishiguchi | |
| 5,470,787 | A * | 11/1995 | Greer | 438/614 |
| 6,853,076 | B2 * | 2/2005 | Datta et al. | 257/738 |
| 7,325,716 | B2 * | 2/2008 | Debelius et al. | 228/180.22 |
| 2002/0090756 | A1 | 7/2002 | Tago et al. | |
| 2003/0193094 | A1 * | 10/2003 | Takahashi et al. | 257/780 |
| 2004/0100164 | A1 * | 5/2004 | Murata et al. | 310/348 |
| 2004/0119247 | A1 | 6/2004 | Zequn | |
| 2005/0242426 | A1 | 11/2005 | Kwon et al. | |
| 2006/0148233 | A1 * | 7/2006 | Datta et al. | 438/614 |
| 2007/0290300 | A1 | 12/2007 | Kawakami | |
| 2009/0243098 | A1 * | 10/2009 | Farooq et al. | 257/738 |

FOREIGN PATENT DOCUMENTS

| CN | 1700458 A | 11/2005 |
| CN | 101079410 A | 11/2007 |
| JP | 5-315338 A | 11/1993 |
| JP | 2004-202581 A | 7/2004 |
| JP | 2007-234841 A | 8/2007 |

* cited by examiner

*Primary Examiner* — Scott B Geyer
(74) *Attorney, Agent, or Firm* — Nixon & Vanderhye, P.C.

(57) ABSTRACT

A semiconductor device includes a semiconductor substrate on which an electrode and a Cu bump are stacked. On the electrode and the Cu bump, a metal bump layer is provided. The metal bump layer comprises (i) a solder layer via which the semiconductor device is bonded and electrically connected to the mounting substrate by metal bonding and (ii) a Cu layer. A intermetallic compound can be formed by interdiffusion of the Cu layer and the solder layer.

7 Claims, 19 Drawing Sheets

SEMICONDUCTOR DEVICE, METHOD FOR MOUNTING SEMICONDUCTOR DEVICE, AND MOUNTING STRUCTURE OF SEMICONDUCTOR DEVICE

This Nonprovisional application claims priority under 35 U.S.C. §119(a) on Patent Application No. 2008-130846 filed in Japan on May 19, 2008, the entire contents of which are hereby incorporated by reference.

TECHNICAL FIELD

The present invention relates to a semiconductor device, a method for mounting a semiconductor device, and a mounting structure for a semiconductor device, each of which for bonding and electrically connecting a semiconductor device and a mounting substrate by flip chip mounting by means of metal bonding.

BACKGROUND ART

Conventionally, a semiconductor substrate in a semiconductor device and a mounting substrate have been electrically connected by wire bonding.

However, with electrical connection by the wire bonding, it is necessary to provide an area in the vicinity of edges of the semiconductor substrate and the mounting substrate to which an end of a wire that is used for the electrical connection is connected. Therefore, there has been a problem with the electrical connection by wire bonding that a mounting structure of a semiconductor device becomes large in size.

Moreover, the electrical connection by the wire bonding has a long connection distance between the semiconductor substrate and the mounting substrate. This increases inductance of the wire, and thereby makes it difficult to carry out high speed driving.

In order to solve these problems occurring with the wire bonding, flip chip mounting has been proposed in the recent years.

The flip chip mounting is a mounting method in which (i) a bump to be used for bonding with a mounting substrate is provided on a functional surface of the semiconductor substrate, (ii) the functional surface of the semiconductor substrate and a surface of the mounting substrate are positioned so as to face each other, and (iii) the bump and an electrode on the surface of the mounting substrate are bonded together.

There are several ways of flip chip mounting; among the several ways, mounting methods by means of metal bonding allow attainment of high mounting reliability, and can also have a fine pitch. For such reason, the mounting methods by means of the metal bonding have become the mainstream of the flip chip mounting.

Furthermore, among the mounting methods by means of the metal bonding, a mounting method by means of metal bonding using Cu and solder can be realized at low costs, and can attain a high mounting reliability to a substantially same degree as that of a mounting method by means of metal bonding using Au and solder.

In the flip chip mounting method in which metal bonding is carried out, heat is applied to the metals used for carrying out the metal bonding so as to bond these metals together. Heat generated by this application of heat causes interdiffusion of metals.

However, if an amount of a metal used for bonding is great in carrying out the metal bonding, the metal used for the bonding cannot be completely formed into an intermetallic compound. As a result, a bonding part which has been subjected to the metal bonding includes the intermetallic compound and the metal used for the bonding. Bonding strength is extremely weak at an interface between the intermetallic compound and the metal used for the bonding. Hence, application of a just minute force causes occurrence of a breakage.

One example of this is as described below. With the mounting method for flip chip mounting by means of metal bonding of Cu and solder, the Cu and solder are heated, so as to bond the Cu and the solder together. The heat generated due to the application of heat to the Cu and solder causes the interdiffusion of the Cu and the Sn (tin) contained in the solder. However, if the amount of solder is great, the solder cannot be completely formed into the intermetallic compound. This causes a bonded part of the Cu and the solder to include the solder, as well as a $Cu_3Sn$ layer and a $Cu_6Sn_5$ layer which are the intermetallic compounds. The interface between the $Cu_6Sn_5$ layer and the solder is extremely weak in bonding strength. Therefore, a breakage occurs just by application of a minute force to the interface.

Patent Literature 1 (Japanese Patent Application Publication, Tokukai, No. 2002-110726 A (Publication Date: Apr. 12, 2002)) discloses a technique which applies a thin layer of bonding material, namely, for reducing an amount of the bonding material used, with a semiconductor device in which the bonding material used for bonding is stacked on at least one of electrode material of a semiconductor substrate and electrode material of a mounting substrate. If the amount of the bonding material is reduced, the bonding material can be completely formed into the intermetallic compound; thus, it would be possible to suppress the occurrence of the problem related to the breakage.

However, as in the technique disclosed in Patent Literature 1, if the amount of the bonding material is decreased in amount, the bonding part itself becomes narrow, which causes the mounting reliability to decrease.

SUMMARY

An object of the technology disclosed herein is to realize a semiconductor device, a method for mounting a semiconductor device, and a mounting structure of a semiconductor device, each of which improves bonding strength in a flip chip mounting by means of metal bonding, while avoiding the mounting reliability to decrease.

In order to attain the object, a semiconductor device in accordance with the technology disclosed herein is a semiconductor device to be bonded and electrically connected to a mounting substrate by metal bonding, the semiconductor device including a semiconductor substrate on which an electrode is provided, a metal bump being stacked on the electrode, the metal bump including (i) bonding material via which the semiconductor device is bonded and electrically connected to the mounting substrate and (ii) metal material, an intermetallic compound being formed by interdiffusion of the metal material and the bonding material.

According to the arrangement, a semiconductor device in accordance with the technology disclosed herein is bonded and electrically connected to a mounting substrate by means of metal bonding via a metal bump. The metal bump is stacked on an electrode provided on a semiconductor substrate, and includes bonding material and metal material.

The metal material included in the metal bump upon metal bonding forms an intermetallic compound due to interdiffusion of the metal material and the bonding material that are included in the metal bump. Namely, the metal material is an initiation point of formation of the intermetallic compound from the bonding material.

As such, an increase in the initiation point of forming the intermetallic compound by use of the metal material accelerates the formation of the intermetallic compound from the bonding material.

Hence, the semiconductor device in accordance with the technology disclosed herein is capable of completely converting the bonding material to the intermetallic compound, without the need of reducing the amount of the bonding material. The semiconductor device in accordance with the technology disclosed herein does not require reducing the amount of bonding material; thus, the mounting reliability does not decrease. Furthermore, since the bonding material is completely formed into the intermetallic compound after the metal bonding is carried out, the bonding strength improves, and therefore occurrence of a problem regarding the breakage is suppressed.

Therefore, it is possible to improve bonding strength in flip chip mounting by means of metal bonding, while avoiding a decrease in mounting reliability.

In order to attain the object, a method in accordance with the technology disclosed herein for mounting a semiconductor device, the method including the steps of: stacking a metal bump on an electrode provided on a semiconductor substrate, the metal bump including (i) bonding material via which the semiconductor device is bonded and electrically connected to a mounting substrate by metal bonding and (ii) metal material, an intermetallic compound being formed by interdiffusion of the metal material and the bonding material; stacking, by a precoating method or a plating method, the bonding material on an electrode made of the metal material and provided on a mounting substrate; and carrying out metal bonding of the metal bump and the bonding material stacked on the electrode provided on the mounting substrate.

According to the method, a semiconductor device is mounted on a mounting substrate by flip chip mounting by means of metal bonding; the semiconductor device includes a metal bump made of bonding material and metal material, which metal bump is stacked on an electrode provided on a semiconductor substrate.

Therefore, it is possible to improve bonding strength in flip chip mounting by means of metal bonding, while avoiding a decrease in mounting reliability.

In order to attain the object, a method in accordance with the technology disclosed herein for mounting a semiconductor device, the method including the steps of: stacking a metal bump layer on an electrode provided on a semiconductor substrate, the metal bump layer being prepared by stacking a layer made of metal material on a layer made of bonding material, the layer made of bonding material via which the semiconductor device is bonded and electrically connected to a mounting substrate by metal bonding, and the layer made of metal material, an intermetallic compound being formed by interdiffusion of the metal material and the bonding material; stacking, by a precoating method or a plating method, the bonding material on an electrode made of the metal material and provided on a mounting substrate; and carrying out metal bonding of the metal bump layer and the bonding material stacked on the electrode provided on the mounting substrate.

According to the method, a semiconductor device is mounted to a mounting substrate which includes bonding material by flip chip mounting by means of metal bonding; the semiconductor device has a metal bump layer stacked on an electrode provided on a semiconductor substrate, which metal bump layer has a metal material layer stacked on a bonding material layer.

Therefore, it is possible to improve bonding strength in flip chip mounting by means of metal bonding, while avoiding a decrease in mounting reliability.

In order to attain the object, a method in accordance with the technology disclosed herein for mounting a semiconductor device includes the steps of: stacking a metal bump layer on an electrode provided on a semiconductor substrate, the metal bump layer being prepared by stacking a layer made of metal material on a layer made of bonding material, the layer made of bonding material via which the semiconductor device is bonded and electrically connected to a mounting substrate by metal bonding, and the layer made of metal material, an intermetallic compound being formed by interdiffusion of the metal material and the bonding material; stacking another layer made of the bonding material on the metal bump layer; and carrying out metal bonding of (i) an electrode made of the metal material and provided on a mounting substrate and (ii) the layer made of the bonding material stacked on the metal bump layer.

According to the method, a semiconductor device is mounted on a mounting substrate which does not include bonding material, by flip chip mounting by means of metal bonding; the semiconductor device has a metal bump layer stacked on an electrode provided on a semiconductor substrate, which metal bump layer has a metal material layer stacked on a bonding material layer.

Therefore, it is possible to improve bonding strength in flip chip mounting by means of metal bonding, while avoiding a decrease in mounting reliability.

A mounting structure of the semiconductor device in accordance with the technology disclosed herein is arranged such that the mounting substrate and the semiconductor substrate are mounted by any one of the foregoing methods for mounting the semiconductor device.

Therefore, it is possible to improve bonding strength in flip chip mounting by means of metal bonding, while avoiding a decrease in mounting reliability.

For a fuller understanding of the nature and advantages of the invention, reference should be made to the ensuing detailed description taken in conjunction with the accompanying drawings.

DESCRIPTION OF EMBODIMENTS

Figure 33:
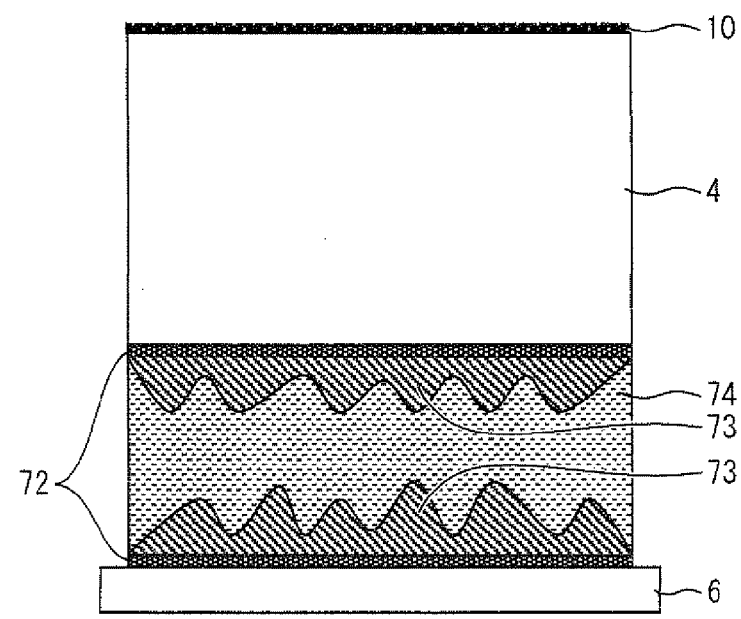
FIG. 33 is a cross sectional view illustrating one example of a bonding and electrically connected state of electrodes provided on a semiconductor substrate and electrodes provided on a mounting substrate, which electrodes are bonded together by metal bonding, respectively.

The following description explains a problem of the occurrence of a breakage due to application of a minute force, caused by an extremely weak bonding strength at the interface between an intermetallic compound and a metal used for the bonding, with reference to FIG. 33.

FIG. 33 is a cross sectional view illustrating one example of a bonding and electrically connected state of (i) electrodes provided on a semiconductor substrate and (ii) electrodes provided on a mounting substrate, which electrodes are bonded together by metal bonding, respectively.

When a Cu bump 4 provided on a semiconductor substrate and an electrode 6 on the mounting substrate are bonded together with solder 74, the intermetallic compound starts to form from a part of the solder 74 close to the Cu bump 4 and a part of the solder 74 close to the electrode 6 of the mounting substrate. As such, it is difficult for a part of the solder 74 far from the Cu bump 4 and the electrode 6 of the mounting substrate to be formed into the intermetallic compound.

Therefore, if the solder 74 is provided thick, the solder 74 cannot be completely formed into the intermetallic compound, as illustrated in FIG. 33. As a result, the solder 74 remains in this bonding part, together with a $Cu_3Sn$ layer 72 and a $Cu_6Sn_5$ layer 73 which are the formed intermetallic compounds. An interface between the $Cu_6Sn_5$ layer 73 and the solder 74 has an extremely weak bonding strength; thereby causing a problem that breakage occurs just by an application of a minute force to the interface. Note that a member numbered as reference sign 10 is a seed layer for supplying electricity via a plating method.

The following description explains one embodiment of the technology disclosed herein, with reference to FIGS. 1 through 32.

Figure 1:
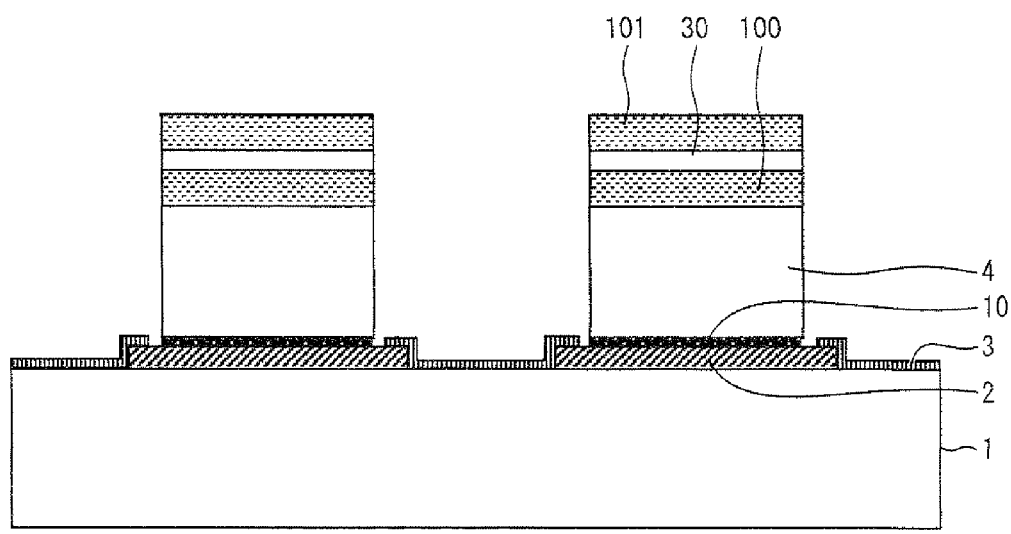
FIG. 1 is a cross sectional view illustrating an arrangement of a semiconductor device in accordance with the technology disclosed herein.
Figure 2:
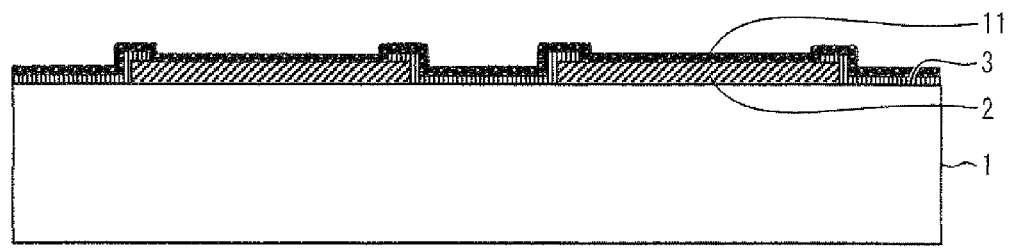
FIG. 2 is a cross sectional view illustrating steps until a seed layer is stacked, in a method for manufacturing the semiconductor device illustrated in FIG. 1.

FIG. 1 is a cross sectional view illustrating an arrangement of a semiconductor device in accordance with the technology disclosed herein.

The semiconductor device illustrated in FIG. 1 includes the following arrangements.

Namely, an electrode (electrode provided on a semiconductor substrate) 2 is provided on an upper surface of a semiconductor substrate 1.

The upper surface of the semiconductor substrate 1 excluding an upper surface of the electrode 2 is covered with a surface protection film 3.

A Cu bump (electrode on the semiconductor substrate) 4 is stacked on the upper surface of the electrode 2, via a seed layer 10 for supplying electricity via a plating method.

Furthermore, the Cu bump 4 has a metal bump layer (metal bump) stacked thereon.

In the semiconductor device illustrated in FIG. 1, the metal bump layer is a layer which stacks a Cu layer (Cu, metal material, layer made of metal material) 30 on a solder layer (Sn, bonding material, layer made of bonding material) 100. The metal bump layer further has a solder layer 101 stacked thereon, however this solder layer 101 is not an essential arrangement, and is omissible. At least one of the solder layer 100 and the Cu layer 30 may be a film formed by, for example, a plating method or sputtering.

With the semiconductor device illustrated in FIG. 1, metal bonding is carried out with an electrode 6 of a mounting electrode 5 (see FIG. 28) for example, by use of the metal bump layer, and furthermore the solder layer 101. That is, the solder layers 100 and 101 are used for bonding and electrically connecting the electrode 2 of the semiconductor device 1 and the electrode 6 of the mounting substrate 5. The Cu layer 30 is provided so as to form $Cu_3Sn$ and $Cu_6Sn_5$ (intermetallic compounds) by interdiffusion of the Cu layer 30 and the solder layer 100, and interdiffusion of the Cu layer 30 and the solder layer 101.

When the semiconductor device illustrated in FIG. 1 is bonded and electrically connected to the electrode 6 of the mounting substrate 5 by means of metal bonding, the $Cu_3Sn$ and $Cu_6Sn_5$ are formed by interdiffusing the Cu layer 30 and the solder layers 100 and 101. That is to say, the Cu layer 30 functions as a new initiation point for forming an intermetallic compound from the solder layers 100 and 101.

As such, the formation of the intermetallic compound from the solder layers 100 and 101 is accelerated by further providing the Cu layer 30, thereby increasing the initiation point for causing formation of the intermetallic compound.

Therefore, in the semiconductor device illustrated in FIG. 1, it is possible to completely form the solder into the intermetallic compound, while not reducing the amount of the solder as the bonding material. Since there is no need to reduce the amount of the solder in the semiconductor device illustrated in FIG. 1, the mounting reliability does not decrease. Further, after the metal bonding is carried out, the solder is completely formed into the intermetallic compound. This thus improves the bonding strength, and prevents breakage of a bonded part.

Therefore, it is possible to improve bonding strength in flip chip mounting by means of metal bonding, while avoiding a decrease in mounting reliability.

The following description explains a method for manufacturing the semiconductor device illustrated in FIG. 1, with reference to FIGS. 2 through 12.

First, an electrode 2 is provided on an upper surface of a semiconductor substrate 1, and the upper surface of the semiconductor substrate 1 excluding an upper surface of the electrode 2 is covered with a surface protection film 3. Thereafter, a seed layer 11, from which the seed layer 10 is formed, is stacked on the upper surface of the electrode 2 and the surface protection film 3, by sputtering (see FIG. 2).

Figure 3:
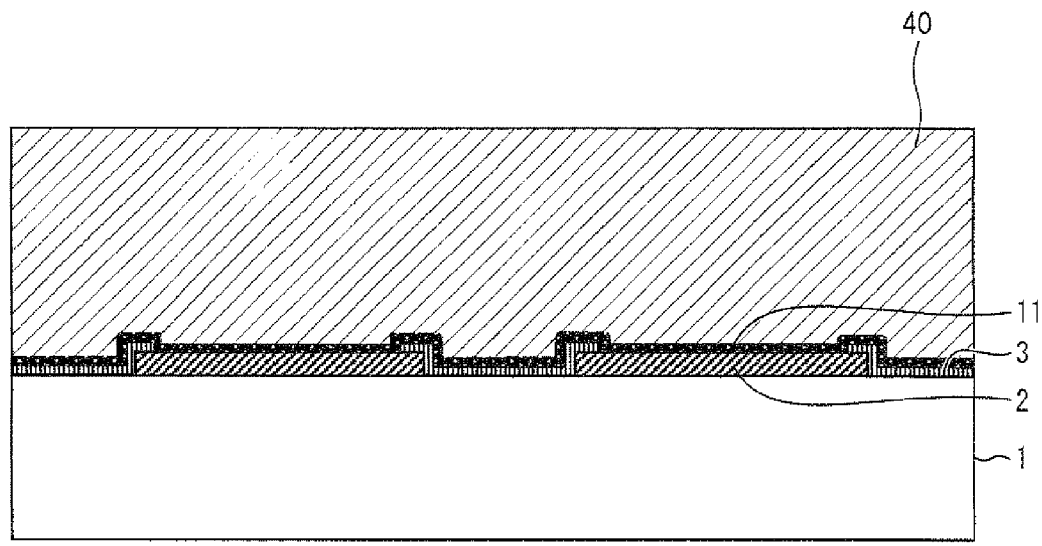
FIG. 3 is a cross sectional view illustrating a photoresist application step in a method for manufacturing the semiconductor device illustrated in FIG. 1.
Figure 4:
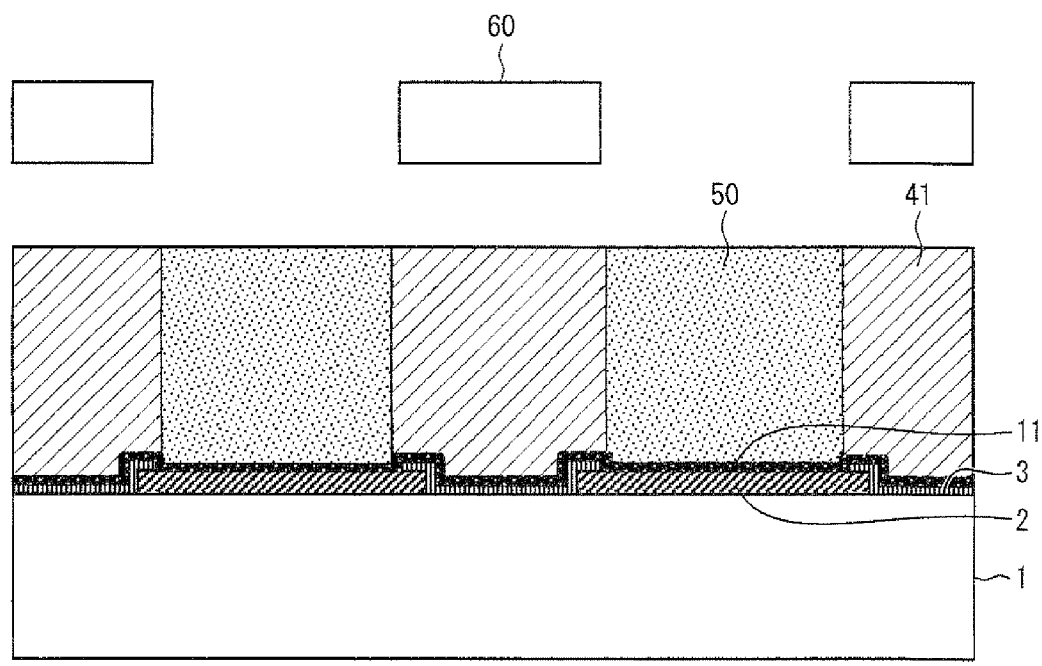
FIG. 4 is a cross sectional view illustrating a photoresist light-exposure step in a method for manufacturing the semiconductor device illustrated in FIG. 1.

A photoresist 40 is applied to the entire seed layer 11 thus stacked (see FIG. 3).

The photoresist 40 thus applied is exposed to light by use of a photomask 60. The photomask 60 covers a photoresist 41 that is applied on the seed layer 11 stacked on the surface protection film 3. A member numbered with a reference sign 50 is the photoresist 40 that has been exposed to light in a step illustrated in FIG. 4 (see FIG. 4).

Figure 5:
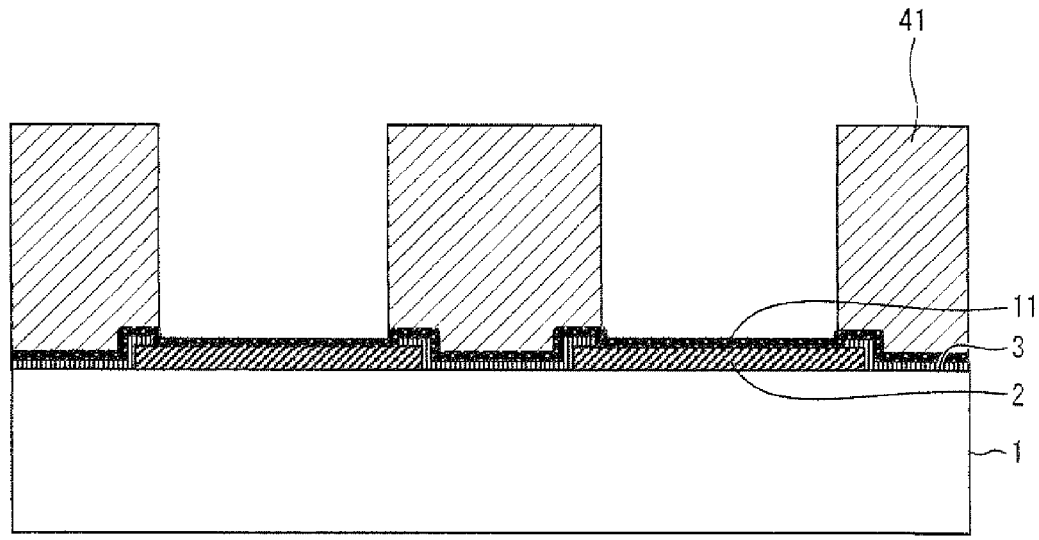
FIG. 5 is a cross sectional view illustrating a seed layer exposure step in a method for manufacturing the semiconductor device illustrated in FIG. 1.

The photoresist 50 that has been exposed to light is removed, and the seed layer 11 stacked on the upper surface of the electrode 2 is exposed (see FIG. 5).

On the exposed seed layer 11 stacked on the upper surface of the electrode 2, a Cu bump 4, a solder layer 102 corresponding to the solder layer 100, a Cu layer 31 corresponding to the Cu layer 30, and a solder layer 103 corresponding to the solder layer 101 are successively stacked. In a case where a pad pitch is 80 μm, it is preferable, for example, for the Cu bump 4 to have a thickness around 45 μm, the solder layers 102 and 103 to each have a thickness around 12 μm, and the Cu layer 31 to have a thickness around 15 μm (see FIG. 6).

Figure 7:
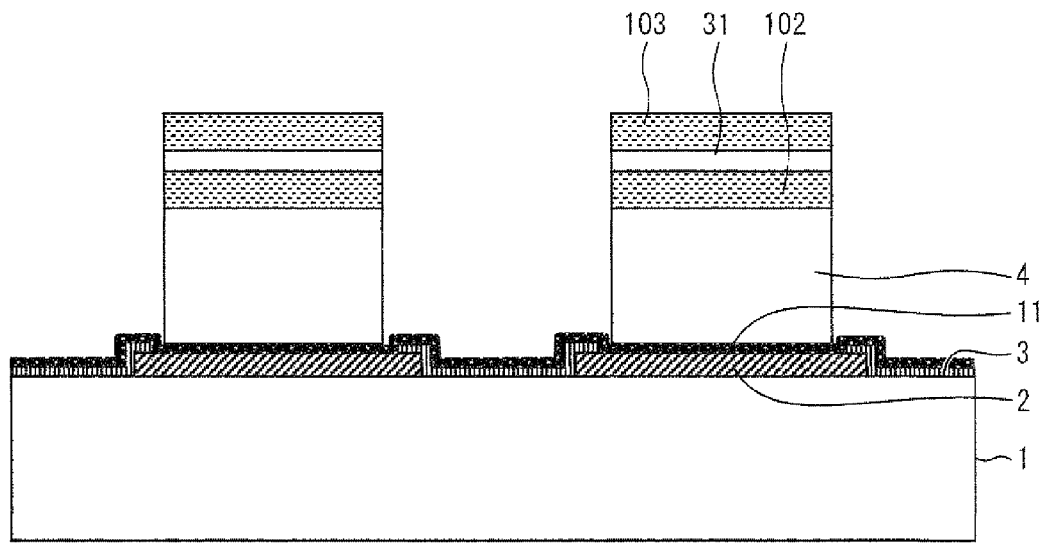
FIG. 7 is a cross sectional view illustrating a photoresist removal step in a method for manufacturing the semiconductor device illustrated in FIG. 1.
Figure 8:
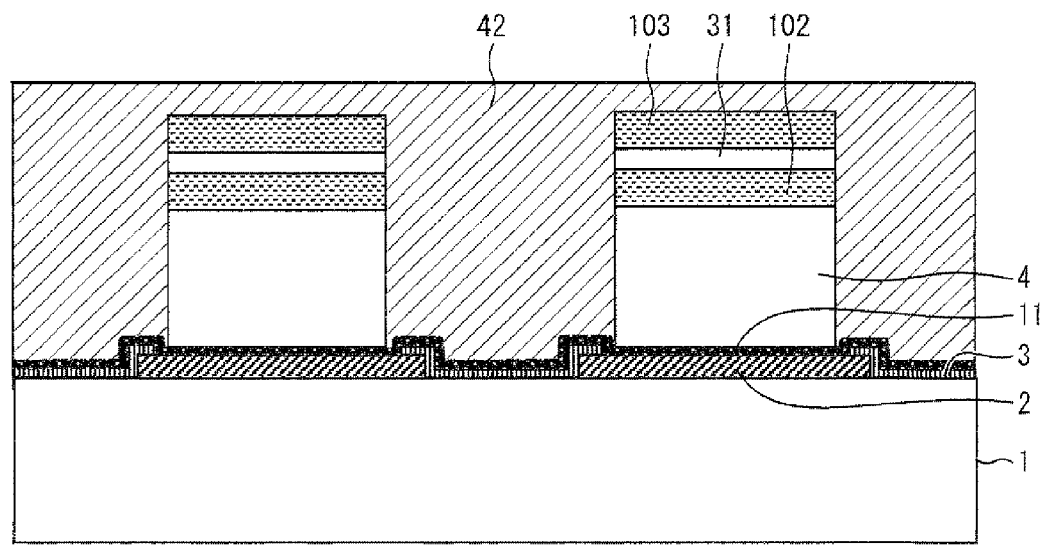
FIG. 8 is a cross sectional view illustrating a photoresist application step in a method for manufacturing the semiconductor device illustrated in FIG. 1.
Figure 9:
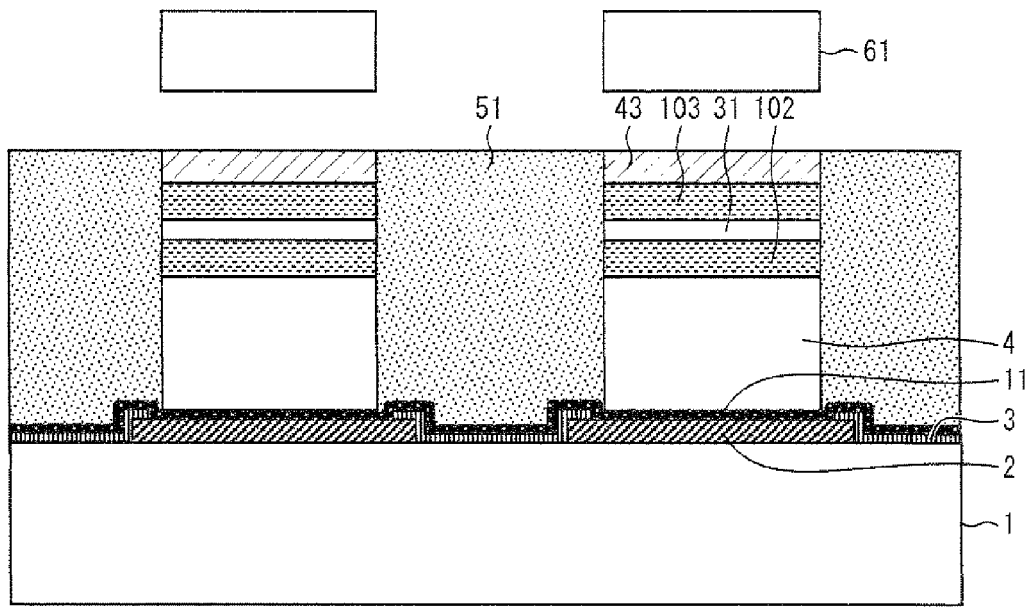
FIG. 9 is a cross sectional view illustrating a photoresist light-exposure step in a method for manufacturing the semiconductor device illustrated in FIG. 1.

The photoresist 41 is removed see FIG. 7).

A photoresist 42 is applied from an upper side of the semiconductor device as illustrated in FIG. 7, which semiconductor device is in the middle of the manufacturing process. The photoresist 42 is applied so as to avoid melting of the solder layer 103 upon removal of the seed layer 11 that is stacked on the surface protection film 3 (see FIG. 8).

The applied photoresist 42 is exposed to light by use of a photomask 61. The photomask 61 covers a photoresist 43 applied on the solder layer 103. A member numbered with a reference sign 51 is the photoresist 42 which has been exposed to light in a step illustrated in FIG. 9 (see FIG. 9).

Figure 10:
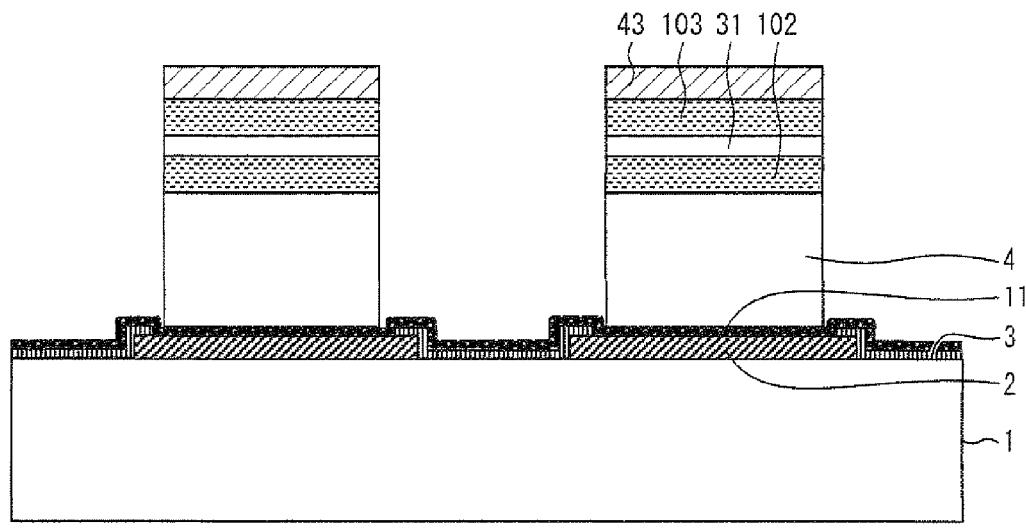
FIG. 10 is a cross sectional view illustrating a photoresist removal step in a method for manufacturing the semiconductor device illustrated in FIG. 1.

The photoresist 51 that has been exposed to light is removed, so as to expose the seed layer 11 that is stacked on the surface protection film 3 (see FIG. 10).

Figure 11:
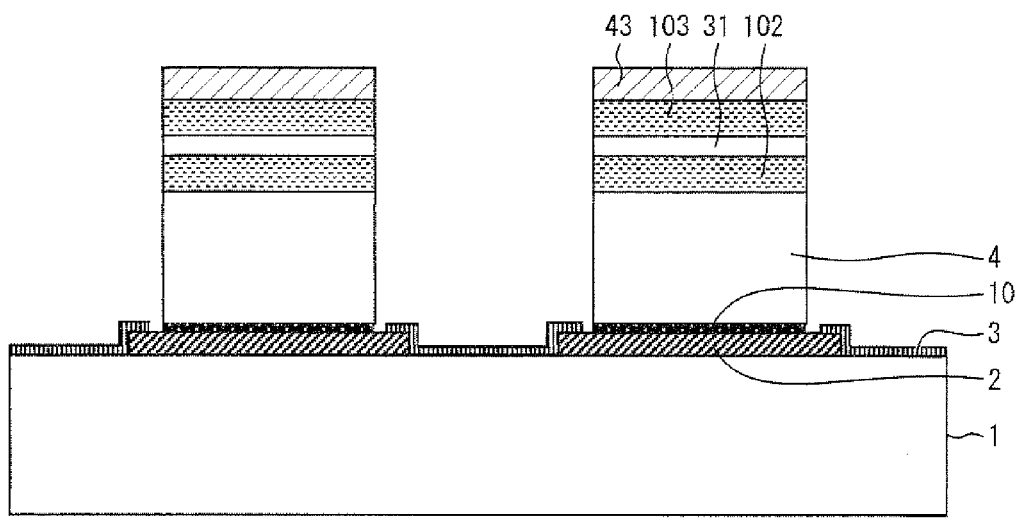
FIG. 11 is a cross sectional view illustrating a seed layer removal step in a method for manufacturing the semiconductor device illustrated in FIG. 1.

The exposed seed layer 11 that is stacked on the surface protection film 3 is removed (see FIG. 11).

Figure 12:
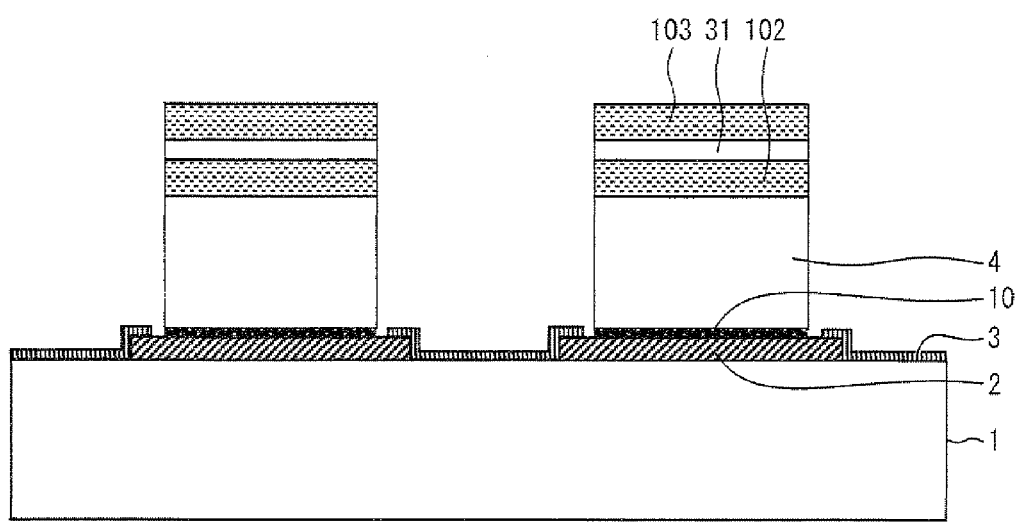
FIG. 12 is a cross sectional view illustrating a photoresist removal step in a method for manufacturing the semiconductor device illustrated in FIG. 1.

The photoresist 43 is removed (see FIG. 12).

Figure 13:
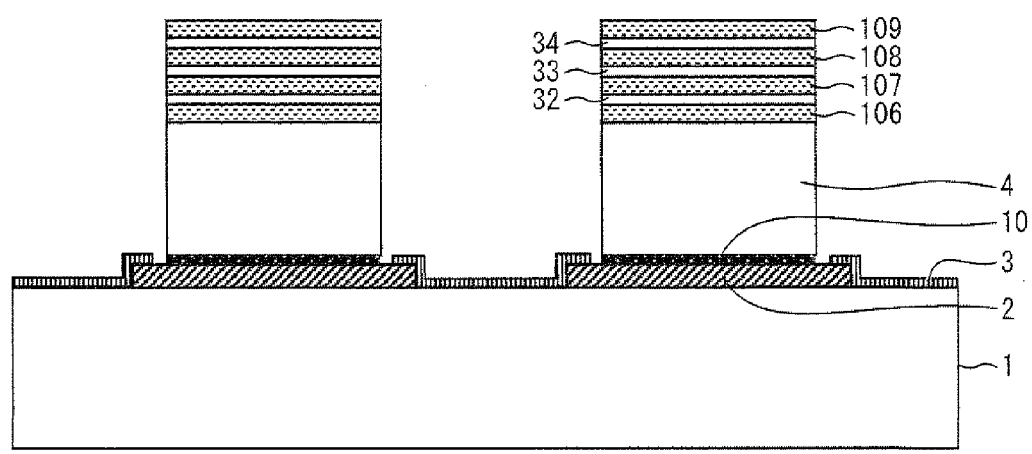
FIG. 13 is a cross sectional view illustrating an arrangement of another semiconductor device in accordance with the technology disclosed herein.

FIG. 13 is a cross sectional view illustrating an arrangement of another semiconductor device in accordance with the technology disclosed herein.

The semiconductor device illustrated in FIG. 13 is different from the semiconductor device illustrated in FIG. 1, in a solder and Cu stacking arrangement stacked on the Cu bump 4, as described below.

Namely, in the semiconductor device illustrated in FIG. 1, a metal bump layer is stacked on the Cu bump 4, which metal bump layer has the Cu layer 30 stacked on the solder layer 100. In comparison, the semiconductor device illustrated in FIG. 13 successively stacks, on the Cu bump 4, a first metal bump layer, a second metal bump layer, and a third metal bump layer: the first metal bump layer in which a Cu layer 32 is stacked on a solder layer 106, a second metal bump layer in which a Cu layer 33 is stacked on a solder layer 107, and a third metal bump layer in which a Cu layer 34 is stacked on a solder layer 108. A solder layer 109 is further stacked on the third metal bump layer, however this solder layer 109 is not an essential arrangement, and is omissible.

That is to say, a plurality of metal bump layers (three layers in the semiconductor device illustrated in FIG. 13) is stacked on the Cu bump 4 of the semiconductor device illustrated in FIG. 13.

In a case where a plurality of metal bump layers are stacked, the formation of the intermetallic compound from the solder layers 106 to 109 is further accelerated since a plurality of Cu layers 32 to 34 are provided. This allows formation of a further uniform intermetallic compound ($Cu_3Sn$ and $Cu_6Sn_5$) upon carrying out of metal bonding to the electrode 6 of the mounting substrate 5, which is carried out thereafter.

Although the number of the metal bump layers is not particularly limited, it is preferable to have around two to five layers thereof, in view of the bonding strength attained after the metal bonding is carried out.

Moreover, thicknesses of the solder layers 106 to 109 are not particularly limited, however is preferably around 3 μm to 12 μm per layer, taking in consideration that the interdiffusion with the Cu layers 32 to 34 proceeds around 3 μm to 6 μm per reflow, and that the Cu layers 32 to 34 that remain after the intermetallic compound is formed electrically connects the intermetallic compounds. Moreover, in order to assuredly convert the solder layers 106 to 109 into the intermetallic compounds, it is necessary to form the Cu layers 32 to 34 thicker than the solder layers 106 to 109.

For example, with the semiconductor device illustrated in FIG. 13, in a case where the pad pitch is 80 μm, it is preferable for the Cu bump 4 to have a thickness of 45 μm, the Cu layers 32 to 34 to each have a thickness of 7 μm, and the solder layers 106 to 109 to each have a thickness of 5 μm.

Figure 6:
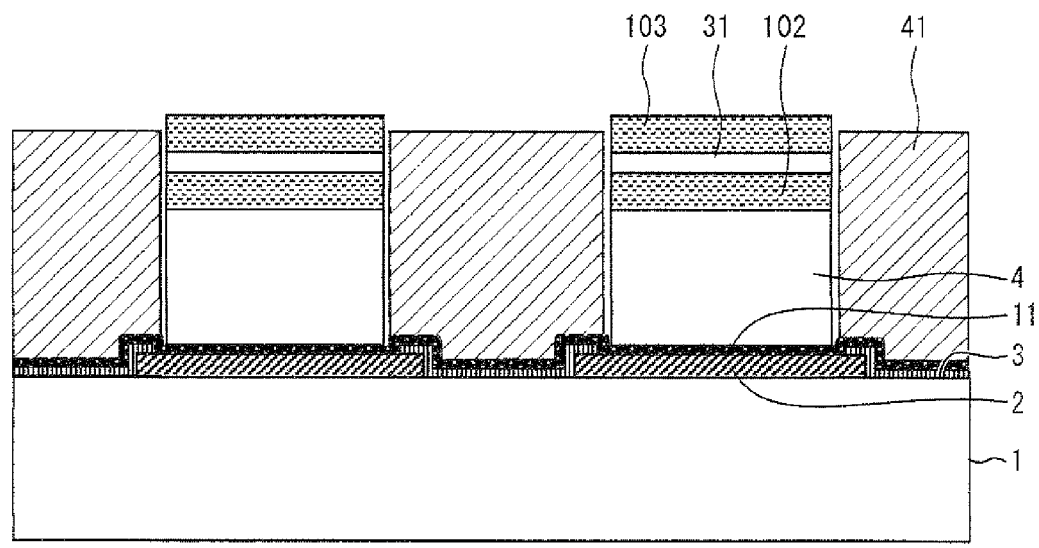
FIG. 6 is a cross sectional view illustrating stacking steps for each layer in a method for manufacturing the semiconductor device illustrated in FIG. 1.

A method for manufacturing a semiconductor device illustrated in FIG. 13 is the same as the method for manufacturing the semiconductor device illustrated in FIG. 1, except that the Cu bump 4, the solder layer 106, the Cu layer 32, the solder layer 107, the Cu layer 33, the solder layer 108, the Cu layer 34, and the solder layer 109 are successively stacked on the seed layer 11 that is stacked on the upper surface of the electrode 2, in the step illustrated in FIG. 6. Therefore, detailed explanations are omitted.

Figure 14:
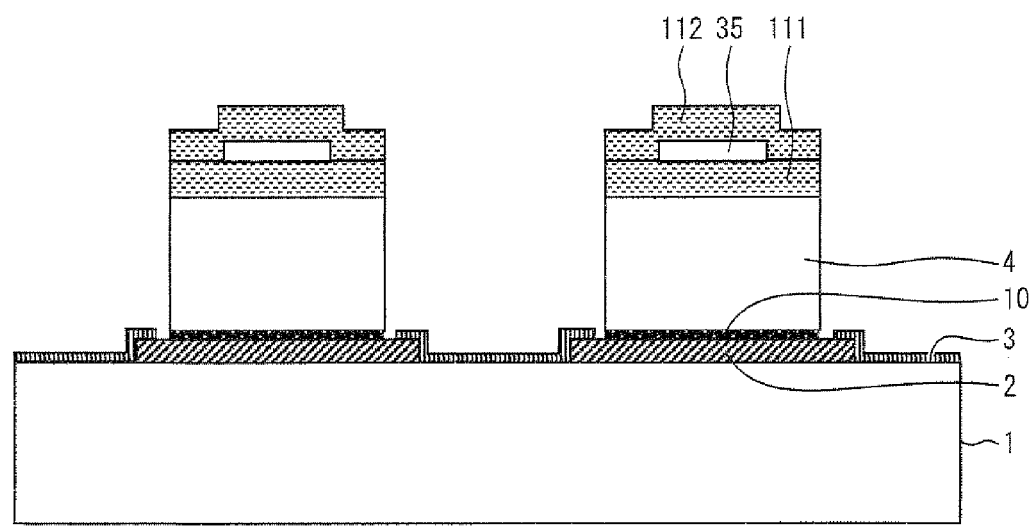
FIG. 14 is a cross sectional view illustrating an arrangement of still another semiconductor device in accordance with the technology disclosed herein.
Figure 15:
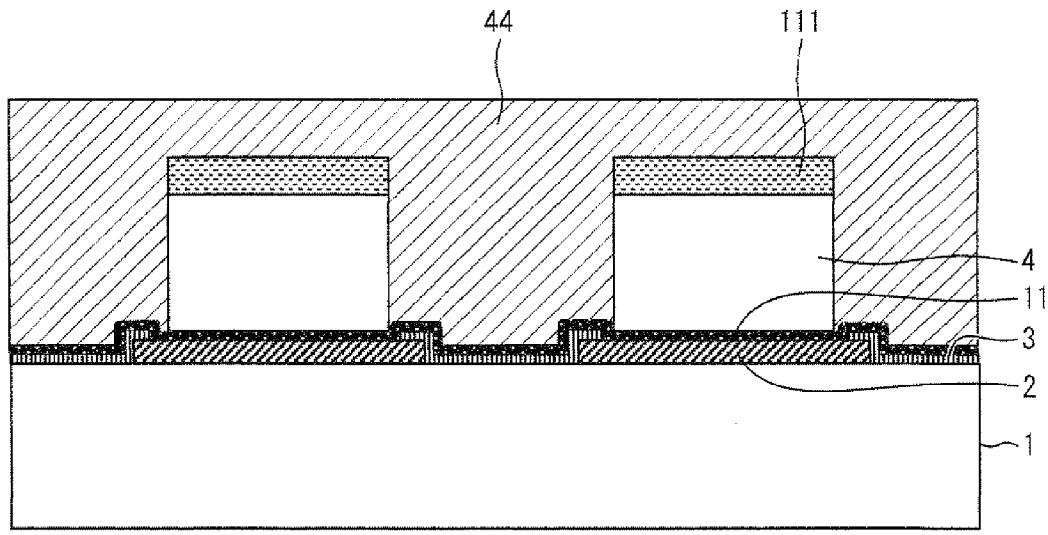
FIG. 15 is a cross sectional view illustrating steps until a photoresist is applied, in a method for manufacturing the semiconductor device illustrated in FIG. 14.

FIG. 14 is a cross sectional view illustrating an arrangement of still another semiconductor device in accordance with the technology disclosed herein.

The semiconductor device illustrated in FIG. 14 is different from the semiconductor device illustrated in FIG. 1, in the solder and Cu stacking arrangement stacked on the Cu bump 4, as described below.

Namely, in the semiconductor device illustrated in FIG. 1, a metal bump layer in which a Cu layer 30 is stacked on a solder layer 100 is stacked on the Cu bump 4.

In comparison, the semiconductor device illustrated in FIG. 14 successively stacks a solder layer 111, a Cu layer 35, and a solder layer 112 on the Cu bump 4. The solder layers 111 and 112 are formed in an integrated manner. That is to say, the Cu layer 35 is provided along the solder layer 112 so as to extend in (preferably extend not less than half of) the solder layer 112. The bonding strength is further improved by forming a plurality of solder layers in the integrated manner.

The following description explains a method for manufacturing the semiconductor device illustrated in FIG. 14, with reference to FIGS. 15 through 27. Steps carried out prior to a step illustrated in FIG. 15 in the method for manufacturing the semiconductor device illustrated in FIG. 14 are the same as the steps illustrated in FIGS. 2 through 5; therefore, explanations of these are omitted.

On an exposed seed layer 11 stacked on the upper surface of the electrode 2, a Cu bump 4 and a solder layer 111 are successively stacked. Thereafter, a photoresist 44 is applied from an upper side of this semiconductor device, which is in the middle of the manufacturing process (see FIG. 15).

The photoresist 44 thus applied is exposed to light by use of a photomask 62. The photomask 62 covers (i) a part of the photoresist 44 that is applied on the seed layer 11 stacked on the surface protection film 3, and (ii) a portion of the photoresist 44 that is applied on the solder layer 111; namely, a photoresist 45. A member numbered as reference sign 52 is the photoresist 44 that is exposed to light in a step illustrated in FIG. 16 (see FIG. 16).

Figure 17:
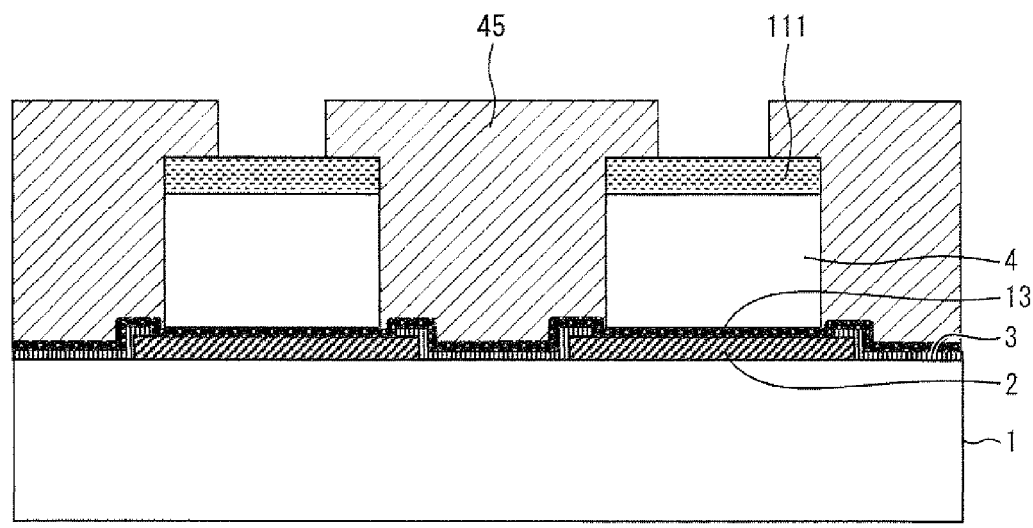
FIG. 17 is a cross sectional view illustrating a photoresist removal and solder layer exposure step in a method for manufacturing the semiconductor device illustrated in FIG. 14.

The photoresist 52 thus exposed to light is removed, so as to partially expose the solder layer 111 (see FIG. 17).

Figure 18:
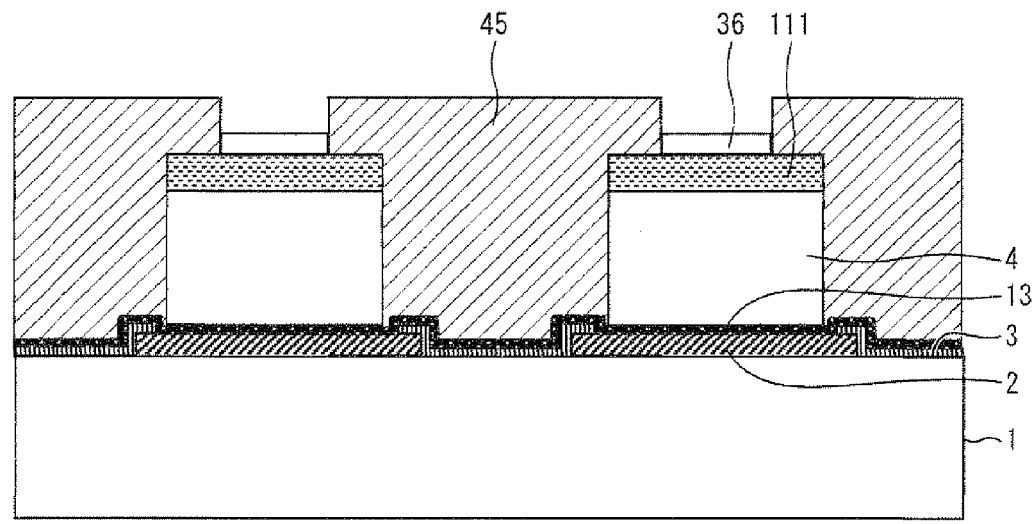
FIG. 18 is a cross sectional view illustrating a Cu layer stacking step in a method for manufacturing the semiconductor device illustrated in FIG. 14.
Figure 19:
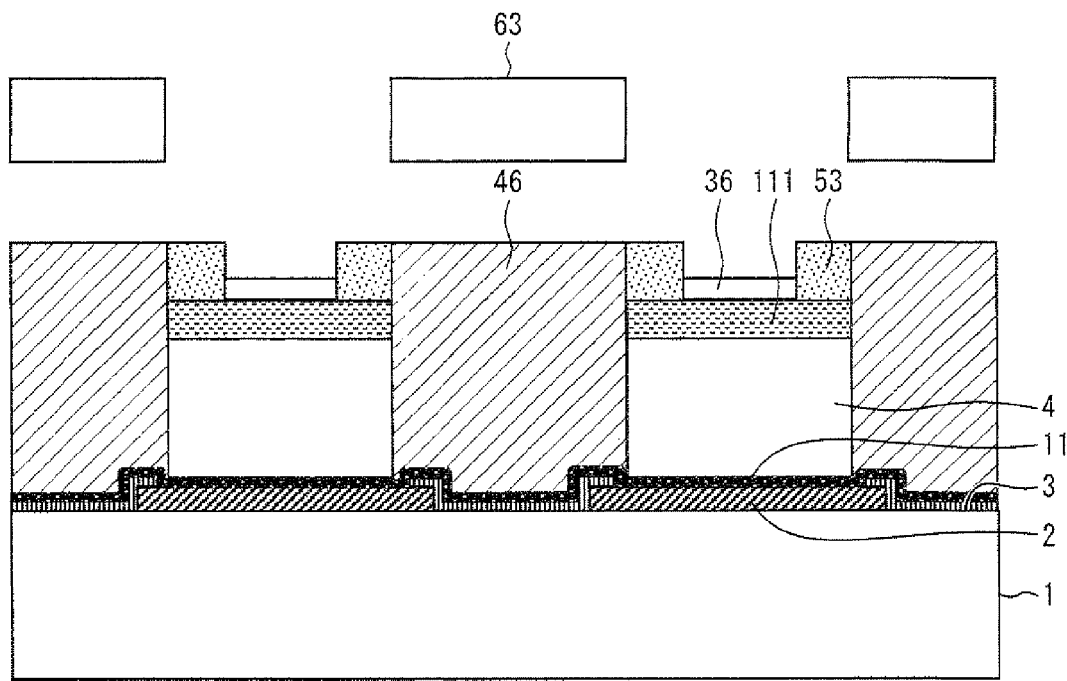
FIG. 19 is a cross sectional view illustrating a photoresist light-exposure step in a method for manufacturing a semiconductor device illustrated in FIG. 14.

A Cu layer 36 corresponding to the Cu layer 35 is stacked on a part at which the solder layer 111 is exposed (see FIG. 18).

Figure 16:
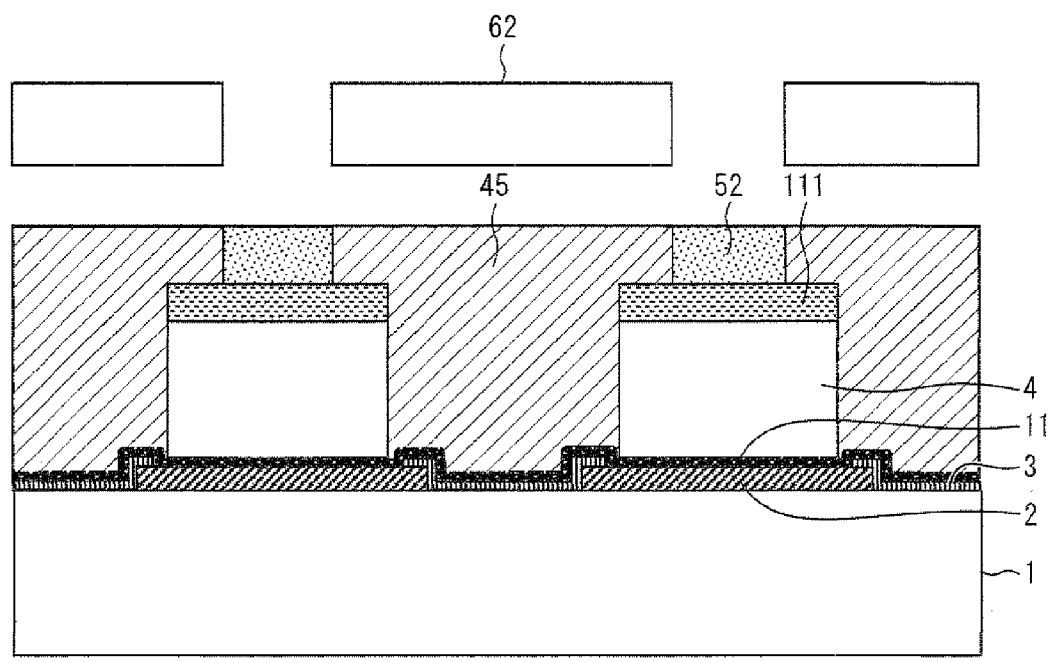
FIG. 16 is a cross sectional view illustrating a photoresist light-exposure step in a method for manufacturing the semiconductor device illustrated in FIG. 14.

The photoresist 45 which has not been exposed to light in the step illustrated in FIG. 16 is exposed to light by use of a photomask 63. The photomask 63 covers a photoresist 46 applied on the seed layer 11 stacked on the surface protection film 3. A member numbered as reference sign 53 is the photoresist 45 which is exposed to light in a step illustrated in FIG. 19 (see FIG. 19).

Figure 20:
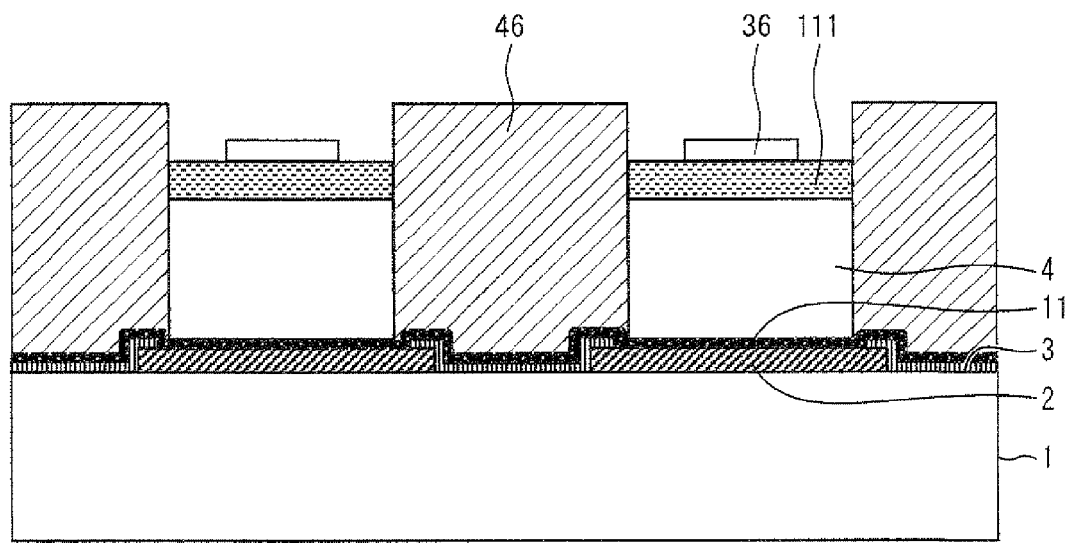
FIG. 20 is a cross sectional view illustrating a photoresist removal step in a method for manufacturing the semiconductor device illustrated in FIG. 14.

The photoresist 53 exposed to light is removed (see FIG. 20).

Figure 21:
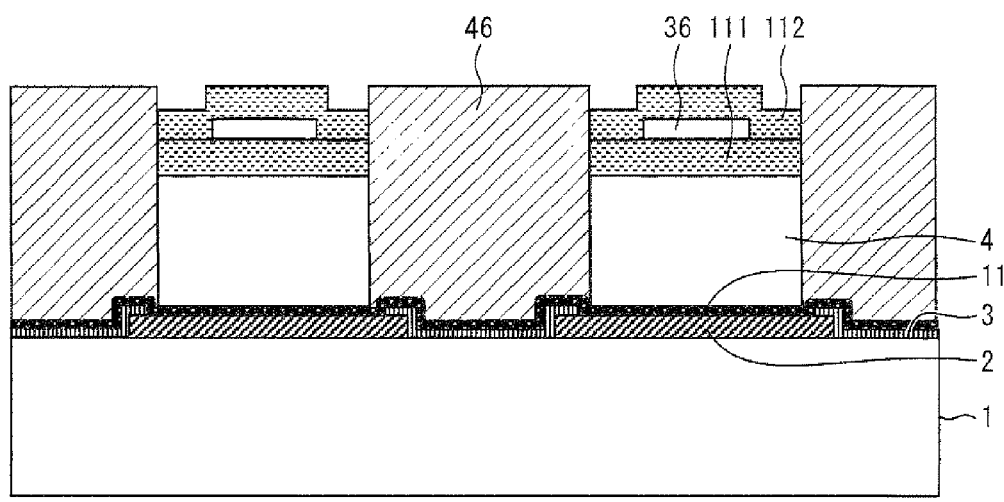
FIG. 21 is a cross sectional view illustrating a solder layer stacking step in a method for manufacturing the semiconductor device illustrated in FIG. 14.

A solder layer 112 is stacked on the solder layer 111 and the Cu layer 36 (see FIG. 21).

Figure 22:
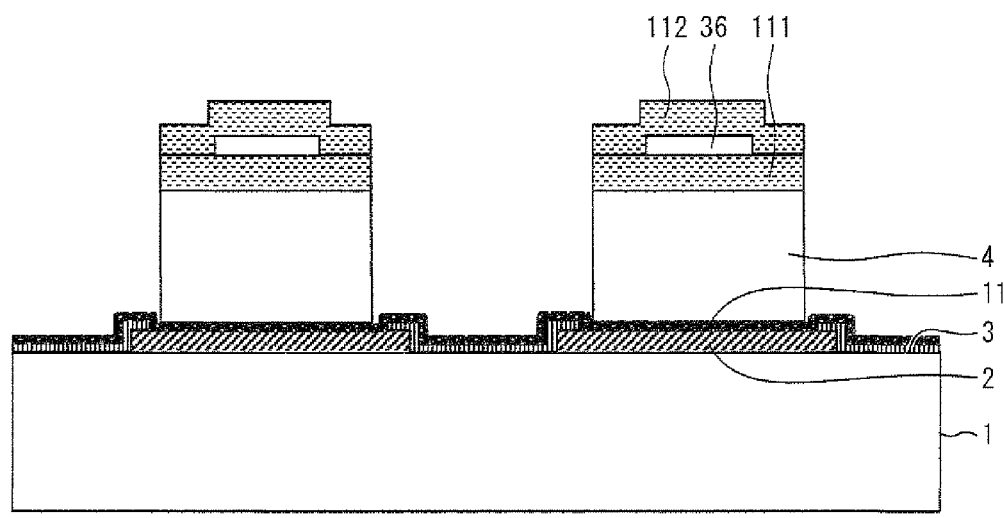
FIG. 22 is a cross sectional view illustrating a photoresist removal step in a method for manufacturing the semiconductor device illustrated in FIG. 14.
Figure 23:
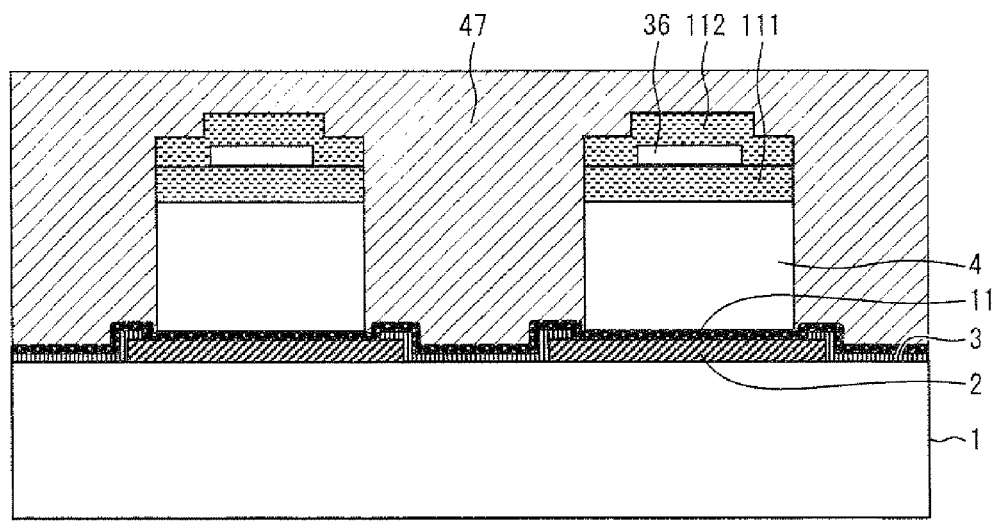
FIG. 23 is a cross sectional view illustrating a photoresist application step in a method for manufacturing the semiconductor device illustrated in FIG. 14.
Figure 24:
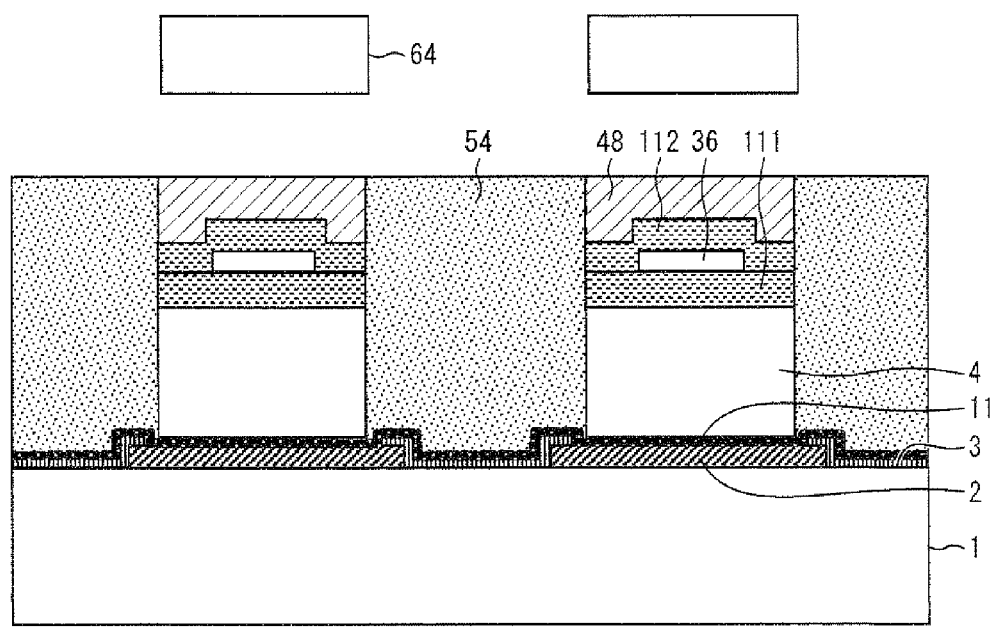
FIG. 24 is a cross sectional view illustrating a photoresist light-exposure step in a method for manufacturing the semiconductor device illustrated in FIG. 14.

The photoresist 46 is removed (see FIG. 22).

A photoresist 47 is applied from an upper side of the semiconductor device illustrated in FIG. 22, which is in the middle of the manufacturing process. This application of the photoresist 47 is carried out to avoid melting of the solder layer 112 when the seed layer 11 stacked on the surface protection film 3 is removed (see FIG. 23).

The applied photoresist 47 is exposed to light by use of a photomask 64. The photomask 64 covers a photoresist 48 that is applied on the solder layer 112. A member numbered as reference sign 54 is the photoresist 47 which is exposed to light in a step illustrated in FIG. 24 (see FIG. 24).

Figure 25:
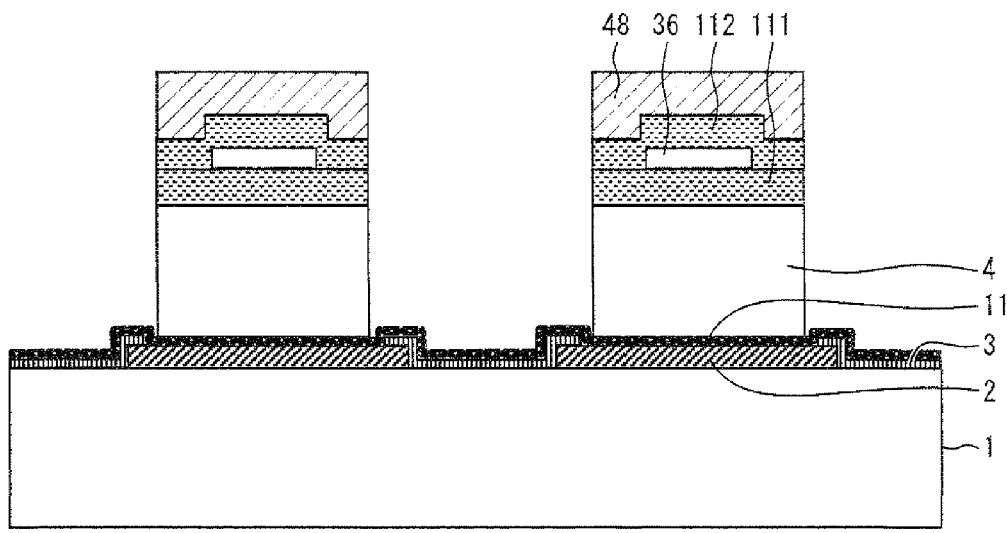
FIG. 25 is a cross sectional view illustrating a photoresist removal step in a method for manufacturing a semiconductor device illustrated in FIG. 14.

The photoresist 54 exposed to light is removed, which exposes the seed layer 11 stacked on the surface protection film 3 (see FIG. 25).

Figure 26:
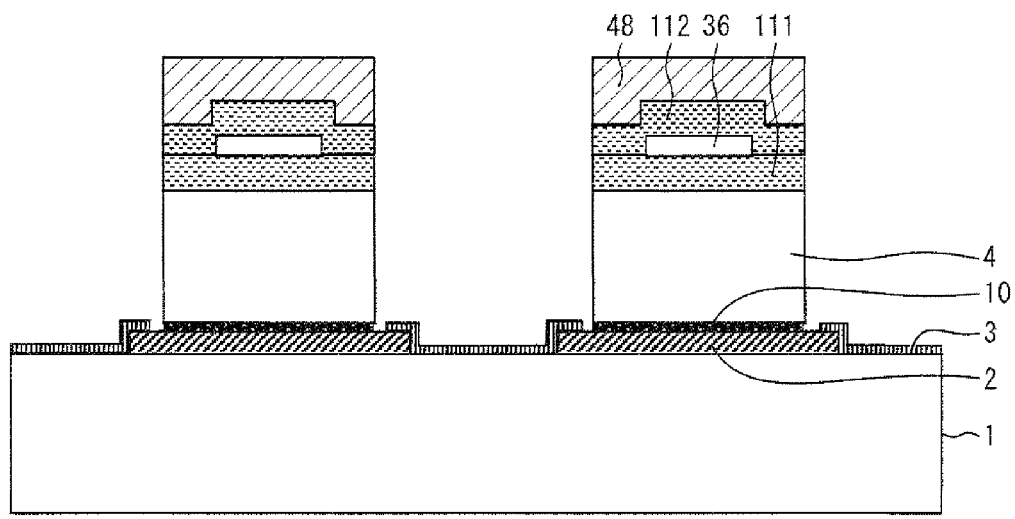
FIG. 26 is a cross sectional view illustrating a seed layer removal step in a method for manufacturing the semiconductor device illustrated in FIG. 14.

The exposed seed layer 11 stacked on the surface protection layer 3 is removed (see FIG. 26).

Figure 27:
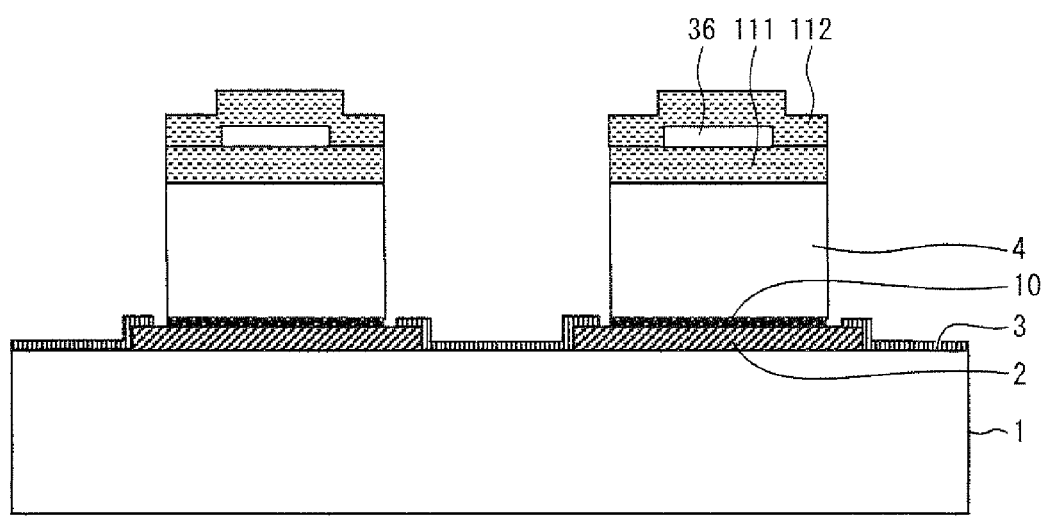
FIG. 27 is a cross sectional view illustrating a photoresist removal step in a method for manufacturing the semiconductor device illustrated in FIG. 14.

The photoresist 48 is removed (see FIG. 27).

Figure 28:
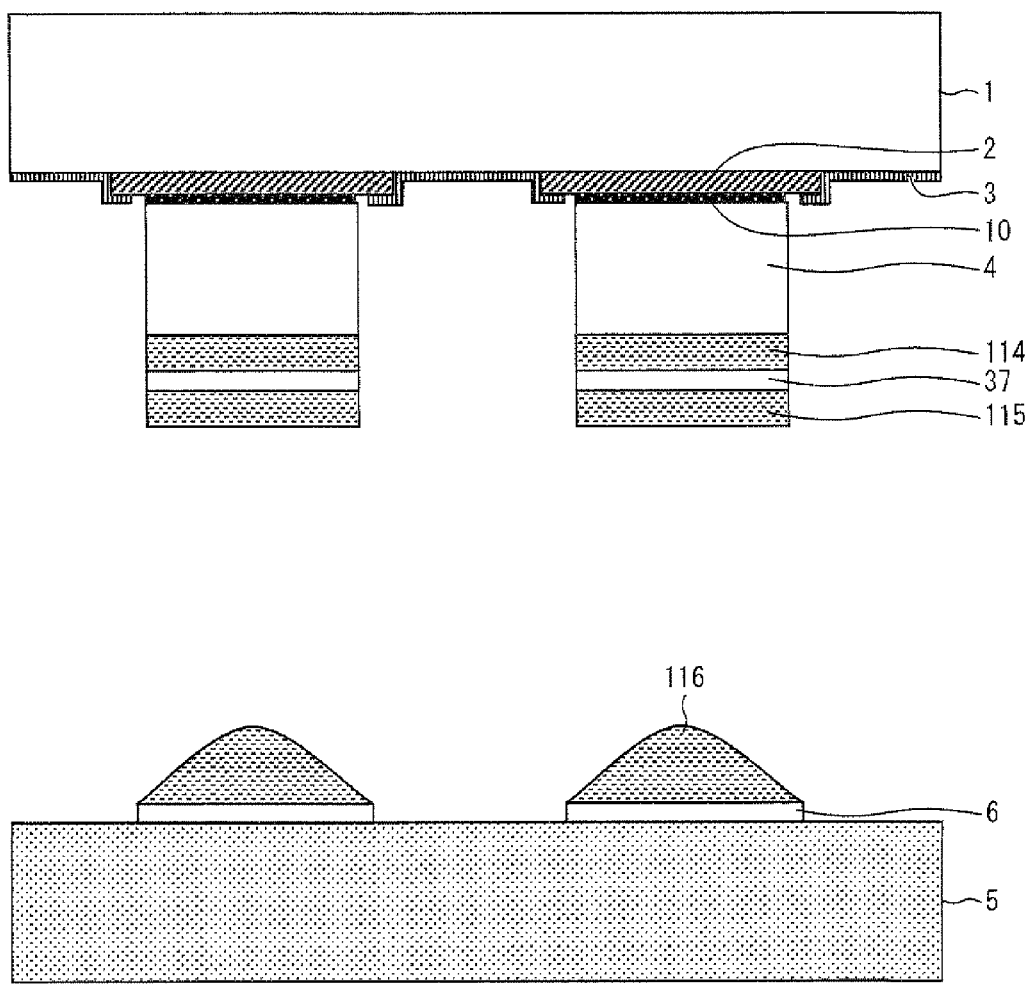
FIG. 28 is a cross sectional view illustrating a method for mounting the semiconductor device illustrated in FIG. 1.
Figure 29:
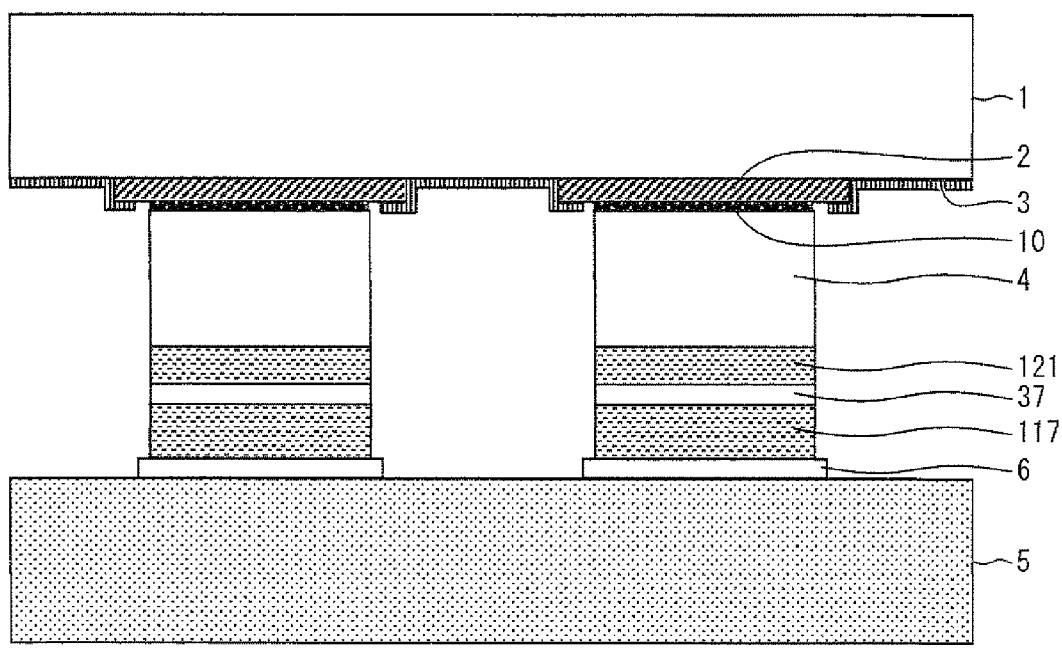
FIG. 29 is a cross sectional view illustrating a mounting structure of a semiconductor device, in which the semiconductor device illustrated in FIG. 1 is mounted on a mounting substrate.

The following description explains a method for mounting a semiconductor device with reference to FIGS. 28 and 29, in which the semiconductor device illustrated in FIG. 1 is actually bonded to an electrode provided on a mounting substrate. For easy explanation, a solder layer 114, a Cu layer 37, and a solder layer 115 in the method for mounting the semiconductor device illustrated in FIG. 28 are explained as corresponding to the solder layer 100, the Cu layer 30, and the solder layer 101 in the semiconductor device illustrated in FIG. 1, respectively.

First, a solder layer 116 to be used for bonding and establishing electrical connection by means of metal bonding is stacked on an electrode 6 provided on a mounting substrate 5, by a precoating method or a plating method. The electrode 6 provided on the mounting substrate 5 is made of the same material as the metal material for example Cu, however the material is not necessarily the same as that of a metal bump layer (see FIG. 28). Namely, although it is preferable for the material of the electrode 6 provided on the mounting substrate 5 to be the same as that of the metal bump layer, there is no problem even if the material is different.

Metal bonding of the semiconductor device illustrated in FIG. 28 and the mounting substrate 5 is carried out by means of fusion bonding the solder layer 115 and the solder layer 116 that is stacked on the electrode 6, by reflow or thermo-compression bonding. The Cu layer 37, the solder layer 114, the solder layer 115 and the solder layer 116 are interdiffused so as to form intermetallic compound layers 117 and 121. This accomplishes a mounting structure of a semiconductor device, in which a mounting substrate 5 and a semiconductor device in accordance with the technology disclosed herein are mounted (see FIG. 29).

In this case, the solder layer 116 is omissible. This is because even if the solder layer 116 is omitted in the metal bonding between the semiconductor device illustrated in FIG. 28 and the electrodes 6 provided on the mounting substrate 5, the metal bonding can still be fusion bonded by the reflow or thermo-compression bonding of the solder layer 115. Further, the intermetallic compound layers 117 and 121 can be formed by interdiffusion of the Cu layer 37 between the solder layers 114 and 115.

Figure 30:
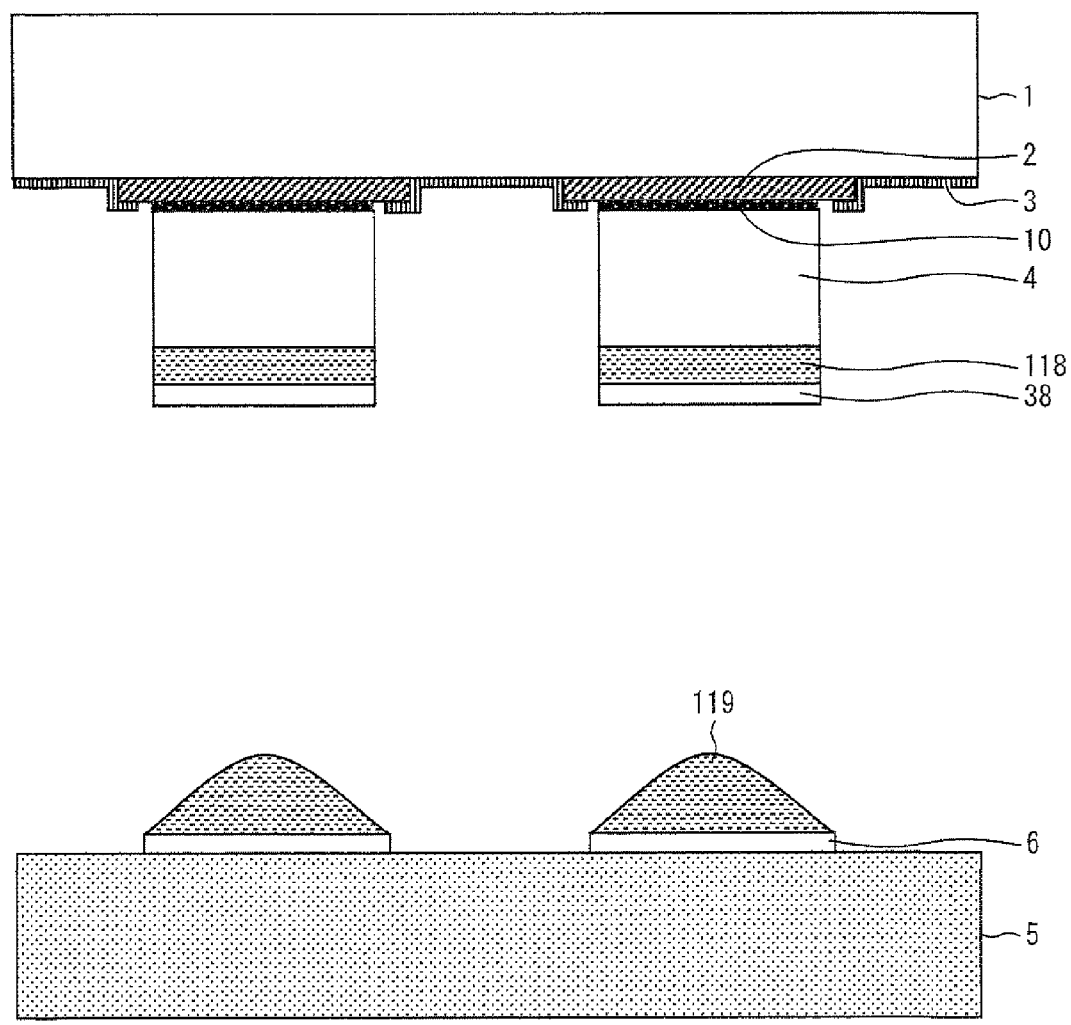
FIG. 30 is a cross sectional view illustrating a method for mounting a modification of the semiconductor device illustrated in FIG. 1.
Figure 31:
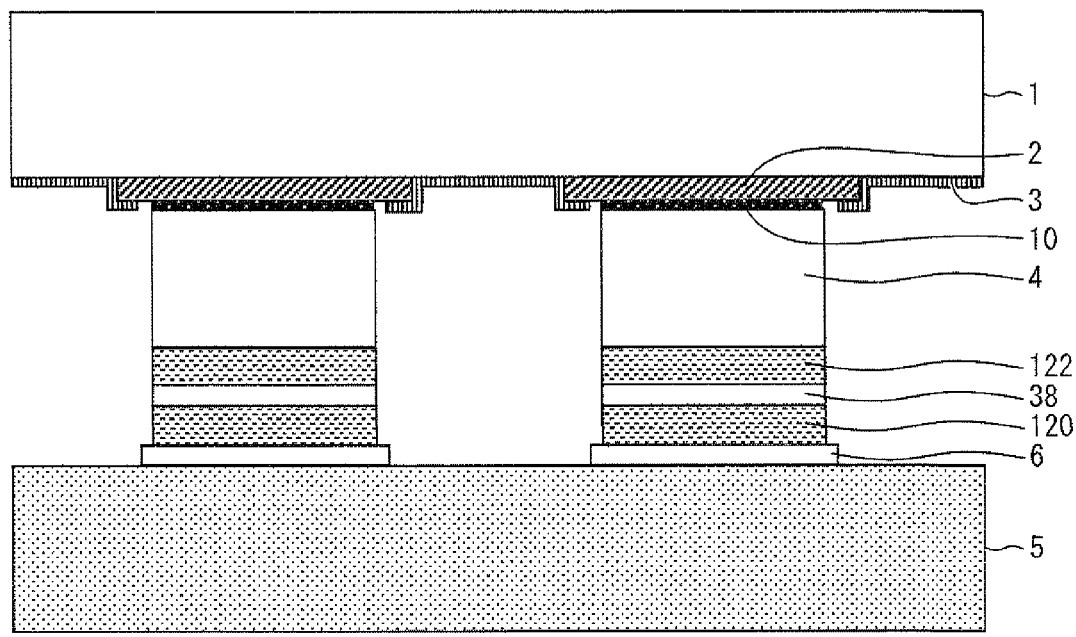
FIG. 31 is a cross sectional view illustrating a mounting structure of a semiconductor device, in which a modification of the semiconductor device illustrated in FIG. 1 is mounted on a mounting substrate.

The following description explains a method for mounting a semiconductor device with reference to FIGS. 30 and 31, in which a modification of the semiconductor device illustrated in FIG. 1, that is, a semiconductor device which does not include a solder layer 101 in the semiconductor device illustrated in FIG. 1, is actually bonded to an electrode on the mounting substrate. For easy explanation, a solder layer 118 and a Cu layer 38 in the method for mounting the semiconductor device illustrated in FIG. 30 are explained so as to correspond to the solder layer 100 and the Cu layer 30 in the semiconductor device illustrated in FIG. 1, respectively.

First, a solder layer 119 to be used for bonding and establishing electrical connection by means of metal bonding is stacked on an electrode 6 provided on a mounting substrate 5, by a precoating method or a plating method (see FIG. 30).

Metal bonding of the semiconductor device illustrated in FIG. 30 and the mounting substrate 5 is carried out by means of fusion bonding the Cu layer 38 and the solder layer 119 that is stacked on the electrode 6, by reflow or thermo-compression bonding. The Cu layer 38, and the solder layers 118 and 119 are interdiffused so as to form intermetallic compound layers 120 and 122. This accomplishes a mounting structure of a semiconductor device, in which a mounting substrate 5 and a modification of the semiconductor device illustrated in FIG. 1 are mounted (see FIG. 31).

It is preferable for the mounting substrate 5 to be a ceramic substrate, an organic substrate, or a silicon interposer substrate.

Figure 32:
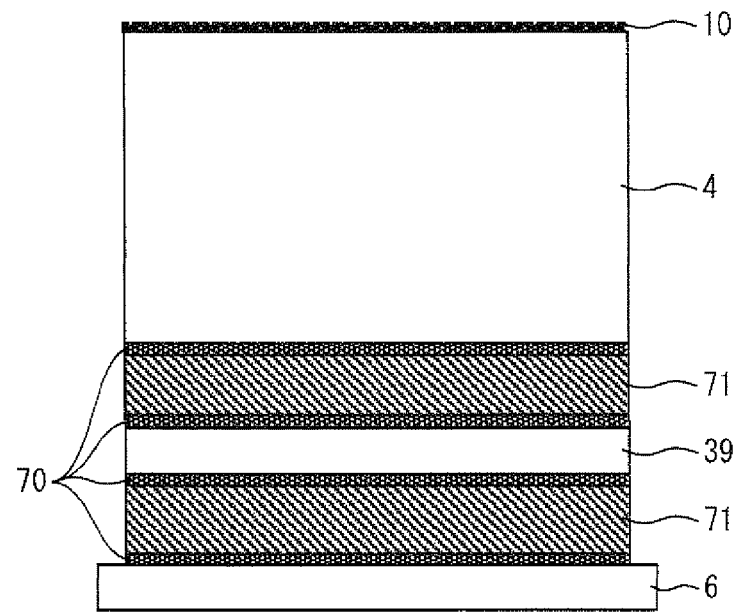
FIG. 32 is a cross sectional view illustrating a bonding and electrically connected state in the mounting structure of the semiconductor device illustrated in FIGS. 29 and 31.

FIG. 32 is a cross sectional view illustrating a bonding and electrically connected state of the mounting structure of a semiconductor device illustrated in FIGS. 29 and 31.

A bonding part between the Cu bump 4 and the electrode 6 of the mounting substrate 5 in the mounting structure of the semiconductor device illustrated in FIGS. 29 and 31 consists essentially of intermetallic compounds: $Cu_3Sn$ layer 70 and $Cu_6Sn_5$ layer 71 (in some cases, further Cu layer 39 as metal material); no solder is present in the bonding part. Therefore, there is no interface between the $Cu_6Sn_5$ layer and solder. That is to say, there is no part where the bonding strength is extremely weak, which thus allows suppression of breakage caused by an application of a minute force.

Moreover, when an edge of an individual semiconductor device sample are grinded following completion of the semiconductor device in individual chip form, the solder 74 may fall off at an interface between the $Cu_6Sn_5$ layer 73 and the solder 74, with a bonding state illustrated in FIG. 33. On the other hand, as in a bonding state illustrated in FIG. 32, in the case where the formation of the intermetallic compound of the solder is sufficiently accelerated, it is possible to prevent the falling off of such solder in the sample.

For easy explanation, the present embodiment explained the metal bump as a metal bump layer in which a Cu layer as the metal material is stacked on a solder layer as the bonding material, in other words, having all (i) the solder as the bonding material, (ii) the Cu as the metal material, and (iii) the intermetallic compound formed by interdiffusion of the solder and the Cu, be in a layer form.

However, the arrangement which has the bonding material, metal material and the intermetallic compound all in layers is not essential in the metal bump in accordance with the technology disclosed herein. That is to say, if the metal bump in accordance with the technology disclosed herein includes bonding material and metal material, it is possible to expect a certain acceleration effect in formation of the intermetallic compound. Needless to say, in the case where the bonding material and/or the metal material is/are not a layer, the intermetallic compound formed by the interdiffusion may also not be in a layer form.

The bonding material in accordance with the technology disclosed herein is not limited to solder (i.e., Sn), and may use, other than the solder, In (indium) or the like. Moreover, the metal material in accordance with the technology disclosed herein is not limited to Cu, and Au, Ni (nickel) and the like may also be used.

The technology disclosed herein is not limited to the description of the embodiments above, but may be altered by a skilled person within the scope of the claims. An embodiment based on a proper combination of technical means disclosed in different embodiments is encompassed in the technical scope of the technology disclosed herein.

The technology disclosed herein is an invention suitable as a method for mounting a semiconductor device and a mounting structure of a semiconductor device, each in which bonding strength is improved while avoiding a decrease in mounting reliability, with a semiconductor device bonded and electrically connected to a mounting substrate by flip chip mounting by means of metal bonding.

In order to attain the object, a semiconductor device in accordance with the technology disclosed herein is a semiconductor device to be bonded and electrically connected to a mounting substrate by metal bonding, the semiconductor device including a semiconductor substrate on which an electrode is provided, a metal bump being stacked on the electrode, the metal bump including (i) bonding material via which the semiconductor device is bonded and electrically connected to the mounting substrate and (ii) metal material, an intermetallic compound being formed by interdiffusion of the metal material and the bonding material.

According to the arrangement, a semiconductor device in accordance with the technology disclosed herein is bonded and electrically connected to a mounting substrate by means of metal bonding via a metal bump. The metal bump is stacked on an electrode provided on a semiconductor substrate, and includes bonding material and metal material.

The metal material included in the metal bump upon metal bonding forms an intermetallic compound due to interdiffusion of the metal material and the bonding material that are included in the metal bump. Namely, the metal material is an initiation point of formation of the intermetallic compound from the bonding material.

As such, an increase in the initiation point of converting the intermetallic compound by use of the metal material accelerates the formation of the intermetallic compound from the bonding material.

Hence, the semiconductor device in accordance with the technology disclosed herein is capable of completely converting the bonding material to the intermetallic compound, without the need of reducing the amount of the bonding material. The semiconductor device in accordance with the technology disclosed herein does not require reducing the amount of bonding material; thus, the mounting reliability does not decrease. Furthermore, since the bonding material is completely formed into the intermetallic compound after the metal bonding is carried out, the bonding strength improves, and therefore suppresses occurrence of a problem regarding the breakage.

Therefore, it is possible to improve bonding strength in flip chip mounting by means of metal bonding, while avoiding a decrease in mounting reliability.

Moreover, the semiconductor device in accordance with the technology disclosed herein is arranged such that the metal bump is constituted by at least one metal bump layer in which a layer made of the metal material is stacked on a layer made of the bonding material.

According to the arrangement, in a case where the mounting substrate includes the bonding material, the semiconductor device can be appropriately bonded and electrically connected to a mounting substrate by use of a metal bump layer.

Moreover, the semiconductor device in accordance with the technology disclosed herein is arranged such that the number of the at least one metal bump layer is at least two layers but not more than five layers.

According to the arrangement, a plurality of metal bump layers is stacked in the semiconductor device. Hence, it is possible to further improve bonding strength.

However, in order to stack a plurality of metal bump layers without changing a height of a bonding part by the metal bonding so as to maintain a low height of the mounting substrate after the mounting is carried out, it is necessary to reduce thickness of the metal bump layer (bonding material layer and metal material layer). However, if the thickness of the bonding material layer and metal material layer in the metal bump layer is reduced in thickness too much, the bonding strength itself decreases, and therefore is not preferable. In view of these points, it is preferable to stack not more than five layers of the metal bump layer.

Moreover, the semiconductor device in accordance with the technology disclosed herein is arranged such that a layer made of the bonding material is further stacked on the metal bump layer.

With this arrangement, the semiconductor device can be appropriately bonded and electrically connected to a mounting substrate by use of the layer made of the bonding material stacked on the metal bump layer, even if the mounting substrate does not include the bonding material.

Moreover, the semiconductor device in accordance with the technology disclosed herein is arranged such that at least one of layers made of the bonding material has a thickness in a range of not less than 3 µm to not more than 12 µm.

Interdiffusion of the bonding material and the metal material upon metal bonding proceeds around 3 µm to 6 µm per reflow. Hence, since the interdiffusion proceeds from the layers made of the metal material that are in contact with both sides of the layer made of the bonding material, the thickness of the layer of the bonding material is preferably 12 µm at the most, so as to convert all of the bonding material to the intermetallic compound. On the other hand, in order to connect the metal material remaining after the formation of the intermetallic compound, the thickness of the intermetallic compound is necessarily at least 3 µm. Namely, the layer made of the bonding material requires to have a thickness of at least 3 µm.

In order to assuredly convert the layer of the bonding material into the intermetallic compound, it is required to provide the layer of the metal material thicker than that of the bonding material.

Moreover, the semiconductor device according to the technology disclosed herein is arranged such that at least one of the layer made of the bonding material and the layer made of the metal material is a film formed by a plating method.

According to the arrangement, at least one of the bonding material layer and the metal material layer is a film formed by a plating method. Thus, it is possible to stack the layer to the electrode provided on the semiconductor substrate, relatively easily.

Moreover, the semiconductor device in accordance with the technology disclosed herein is arranged such that two or more of layers made of the bonding material are formed in an integral manner.

According to the arrangement, a plurality of layers made of the bonding material is formed in an integral manner, i.e., integrated together. Therefore, the bonding strength is further improved.

Moreover, the semiconductor device in accordance with the technology disclosed herein is arranged such that the bonding material is Sn, and the metal material is Cu.

According to the technology disclosed herein, Sn (i.e., solder) is used as the bonding material, and Cu is used as the metal material. Hence, it is possible to attain low cost and high mounting reliability to the same degree as a mounting method by carrying out metal bonding with Au and Sn.

In order to attain the object, a method in accordance with the technology disclosed herein for mounting a semiconductor device, the method including the steps of: stacking a metal bump on an electrode provided on a semiconductor substrate, the metal bump including (i) bonding material via which the semiconductor device is bonded and electrically connected to a mounting substrate by metal bonding and (ii) metal material, an intermetallic compound being formed by interdiffusion of the metal material and the bonding material; stacking, by a precoating method or a plating method, the bonding material on an electrode made of the metal material and provided on the mounting substrate; and carrying out metal bonding of the metal bump and the bonding material stacked on the electrode provided on the mounting substrate.

According to the method, a semiconductor device is mounted on a mounting substrate by flip chip mounting by means of metal bonding; the semiconductor device includes a metal bump made of bonding material and metal material, which metal bump is stacked on an electrode provided on a semiconductor substrate.

Therefore, it is possible to improve bonding strength in flip chip mounting by means of metal bonding, while avoiding a decrease in mounting reliability.

In order to attain the object, a method in accordance with the technology disclosed herein for mounting a semiconductor device, the method including the steps of: stacking a metal bump layer on an electrode provided on a semiconductor substrate, the metal bump layer being prepared by stacking a layer made of metal material on a layer made of bonding material, the layer made of bonding material via which the semiconductor device is bonded and electrically connected to a mounting substrate by metal bonding, and the layer made of metal material, an intermetallic compound being formed by interdiffusion of the metal material and the bonding material; stacking, by a precoating method or a plating method, the bonding material on an electrode made of the metal material and provided on a mounting substrate; and carrying out metal bonding of the metal bump layer and the bonding material stacked on the electrode provided on the mounting substrate.

According to the method, a semiconductor device is mounted to a mounting substrate which includes bonding material, by flip chip mounting by means of metal bonding; the semiconductor device has a metal bump layer stacked on an electrode provided on a semiconductor substrate, which metal bump layer has a metal material layer stacked on a bonding material layer.

Therefore, it is possible to improve bonding strength in flip chip mounting by means of metal bonding, while avoiding a decrease in mounting reliability.

In order to attain the object, a method in accordance with the technology disclosed herein for mounting a semiconductor device includes the steps of: stacking a metal bump layer on an electrode provided on a semiconductor substrate, the metal bump layer being prepared by stacking a layer made of metal material on a layer made of bonding material, the layer made of bonding material via which the semiconductor device is bonded and electrically connected to a mounting substrate by metal bonding, and the layer made of metal material, an intermetallic compound being formed by interdiffusion of the metal material and the bonding material; stacking another layer made of the bonding material on the metal bump layer; and carrying out metal bonding of (i) an electrode made of the metal material and provided on a mounting substrate and (ii) the layer made of the bonding material stacked on the metal bump layer.

According to the method, a semiconductor device is mounted on a mounting substrate which does not include bonding material, by flip chip mounting by means of metal bonding; the semiconductor device has a metal bump layer stacked on an electrode provided on a semiconductor substrate, which metal bump layer has a metal material layer stacked on a bonding material layer.

Therefore, it is possible to improve bonding strength in flip chip mounting by means of metal bonding, while avoiding a decrease in mounting reliability.

Moreover, the method in accordance with the present technology disclosed herein for mounting the semiconductor device is arranged such that the mounting substrate is a ceramic substrate, an organic substrate, or a silicon interposer substrate.

That is to say, the method for mounting the semiconductor device in accordance with the technology disclosed herein can be said as a suitable method for mounting a semiconductor device on a ceramic substrate, an organic substrate, or a silicon interposer substrate.

A mounting structure of the semiconductor device in accordance with the technology disclosed herein is arranged such that the mounting substrate and the semiconductor device are mounted by any one of the foregoing methods for mounting the semiconductor device.

Therefore, it is possible to improve bonding strength in flip chip mounting by means of metal bonding, while avoiding a decrease in mounting reliability.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention claimed is:

1. A semiconductor device to be bonded and electrically connected to a mounting substrate by metal bonding, the semiconductor device comprising:
a semiconductor substrate on which an electrode is provided,
a metal bump being stacked on the electrode, the metal bump including (i) solder via which the semiconductor device is bonded and electrically connected to the mounting substrate and (ii) metal material, the metal material being any one of Cu, Au, and Ni, an intermetallic compound being formed by interdiffusion of the metal material and the solder,
wherein the metal bump comprises at least one metal bump layer, each metal bump layer comprising a layer comprised of the metal material stacked on a layer comprised of the solder; and
wherein the layer comprised of the solder has a thickness in a range of not less than 3 μm to not more than 12 μm.

2. The semiconductor device as set forth in claim 1, wherein at least one of the layer comprised of the solder and the layer made of the metal material is a film formed by a plating method.

3. A semiconductor device to be bonded and electrically connected to a mounting substrate by metal bonding, the semiconductor device comprising:
a semiconductor substrate on which an electrode is provided,
a metal bump being stacked on the electrode, the metal bump including (i) solder via which the semiconductor device is bonded and electrically connected to the mounting substrate and (ii) metal material, the metal material being any one of Cu, Au, and Ni, an intermetallic compound being formed by interdiffusion of the metal material and the solder,
wherein the metal bump comprises at least one metal bump layer, each metal bump layer comprising a layer comprised of the metal material stacked on a layer comprised of the solder; and
wherein at least two but not more than five metal bump layers are stacked on, the electrode.

4. The semiconductor device as set forth in claim 3, wherein at least one of the metal bump layers comprises two or more layers comprised of the solder have portions thereof formed in an integral manner.

5. The semiconductor device as set forth in claim 4, wherein the portions of the solder formed in integral manner have the layer of metal material formed therebetween.

6. A semiconductor device to be bonded and electrically connected to a mounting substrate by metal bonding, the semiconductor device comprising:
a semiconductor substrate on which an electrode is provided,
a metal bump being stacked on the electrode, the metal bump including (i) solder via which the semiconductor device is bonded and electrically connected to the mounting substrate and (ii) metal material, the metal material being any one of Cu, Au, and Ni, an intermetallic compound being formed by interdiffusion of the metal material and the solder,
wherein the metal bump comprises at least one metal bump layer, each metal bump layer comprising a layer comprised of the metal material stacked on a layer comprised of the solder; and
wherein a layer comprised of the solder is further stacked on the metal bump layer.

7. A semiconductor device to be bonded and electrically connected to a mounting substrate by metal bonding, the semiconductor device comprising:
a semiconductor substrate on which an electrode is provided,
a metal bump being stacked on the electrode, the metal bump including (i) solder via which the semiconductor device is bonded and electrically connected to the mounting substrate and (ii) metal material, the metal material being any one of Cu, Au, and Ni, an intermetallic compound being formed by interdiffusion of the metal material and the solder,
wherein the metal bump comprises at least one metal bump layer, each metal bump layer comprising a layer comprised of the metal material stacked on a layer comprised of the solder; and
wherein at least one of layers comprised of the solder has a thickness in a range of not less than 3 μm to not more than 12 μm.

* * * * *